US011475957B2

(12) United States Patent
Zainuddin et al.

(10) Patent No.: US 11,475,957 B2
(45) Date of Patent: Oct. 18, 2022

(54) OPTIMIZED PROGRAMMING WITH A SINGLE BIT PER MEMORY CELL AND MULTIPLE BITS PER MEMORY CELL

(71) Applicant: SanDisk Technologies LLC, Addison, TX (US)

(72) Inventors: Abu Naser Zainuddin, Milpitas, CA (US); Dongxiang Liao, Sunnyvale, CA (US); Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 3 days.

(21) Appl. No.: 17/149,560

(22) Filed: Jan. 14, 2021

(65) Prior Publication Data

US 2022/0223209 A1 Jul. 14, 2022

(51) Int. Cl.
| | |
|---|---|
| *G11C 16/04* | (2006.01) |
| *G11C 16/10* | (2006.01) |
| *G11C 16/08* | (2006.01) |
| *G11C 11/56* | (2006.01) |
| *G11C 16/34* | (2006.01) |

(Continued)

(52) U.S. Cl.
CPC .......... *G11C 16/10* (2013.01); *G11C 11/5671* (2013.01); *G11C 16/0483* (2013.01); *G11C 16/08* (2013.01); *G11C 16/3459* (2013.01); *H01L 27/11565* (2013.01); *H01L 27/11582* (2013.01)

(58) Field of Classification Search
CPC . G11C 16/10; G11C 11/5671; G11C 16/0483; G11C 16/08; G11C 16/3459; H01L 27/11565; H01L 27/11582

USPC .................................................. 365/185.03
See application file for complete search history.

(56) References Cited

U.S. PATENT DOCUMENTS

| 6,072,721 A * | 6/2000 | Arase ................... G11C 16/10 365/185.11 |
| 7,184,309 B2 * | 2/2007 | Matsunaga ........ G11C 16/0483 365/185.25 |

(Continued)

FOREIGN PATENT DOCUMENTS

| WO | WO2019/240851 A1 | 12/2019 | |
| WO | WO-2019240851 A1 * | 12/2019 | ......... G11C 16/0408 |

OTHER PUBLICATIONS

International Search Report & The Written Opinion of the International Searching Authority dated Oct. 5, 2021, International Application No. PCT/US2021/033647.

*Primary Examiner* — Tha-O H Bui
(74) *Attorney, Agent, or Firm* — Vierra Magen Marcus LLP

(57) ABSTRACT

Apparatuses and techniques are described for optimizing programming in a memory device in which memory cells can be programmed using single bit per cell programming and multiple bits per cell programming. In one aspect, a single bit per cell program operation is performed which reduces damage to the memory cells as well as reducing program time. The program operation can omit a pre-charge phase and a verify phase of an initial program loop of a program operation. Instead, a program phase is performed followed by a recovery phase. In one or more subsequent program loops of the single bit per cell program operation, as well as in each program loop of a multiple bit per cell program operation, the program loop includes a pre-charge phase, a program phase, a recovery phase and a verify phase.

20 Claims, 22 Drawing Sheets

(51) Int. Cl.
*H01L 27/11565* (2017.01)
*H01L 27/11582* (2017.01)

(56) References Cited

U.S. PATENT DOCUMENTS

| | | | |
|---|---|---|---|
| 7,463,531 B2 | 12/2008 | Hemink et al. | |
| 7,535,763 B2 | 5/2009 | Hemink | |
| 8,411,503 B2 * | 4/2013 | Lee | G11C 16/10 |
| | | | 365/185.12 |
| 8,498,160 B2 * | 7/2013 | Kim | G11C 11/5628 |
| | | | 365/185.25 |
| 9,548,124 B1 * | 1/2017 | Hazeghi | G11C 7/14 |
| 10,297,323 B2 | 5/2019 | Yu et al. | |
| 10,726,920 B2 | 7/2020 | Yang | |
| 2010/0149881 A1 * | 6/2010 | Lee | G11C 16/16 |
| | | | 365/185.33 |
| 2012/0002470 A1 | 1/2012 | Futatsuyama et al. | |

\* cited by examiner

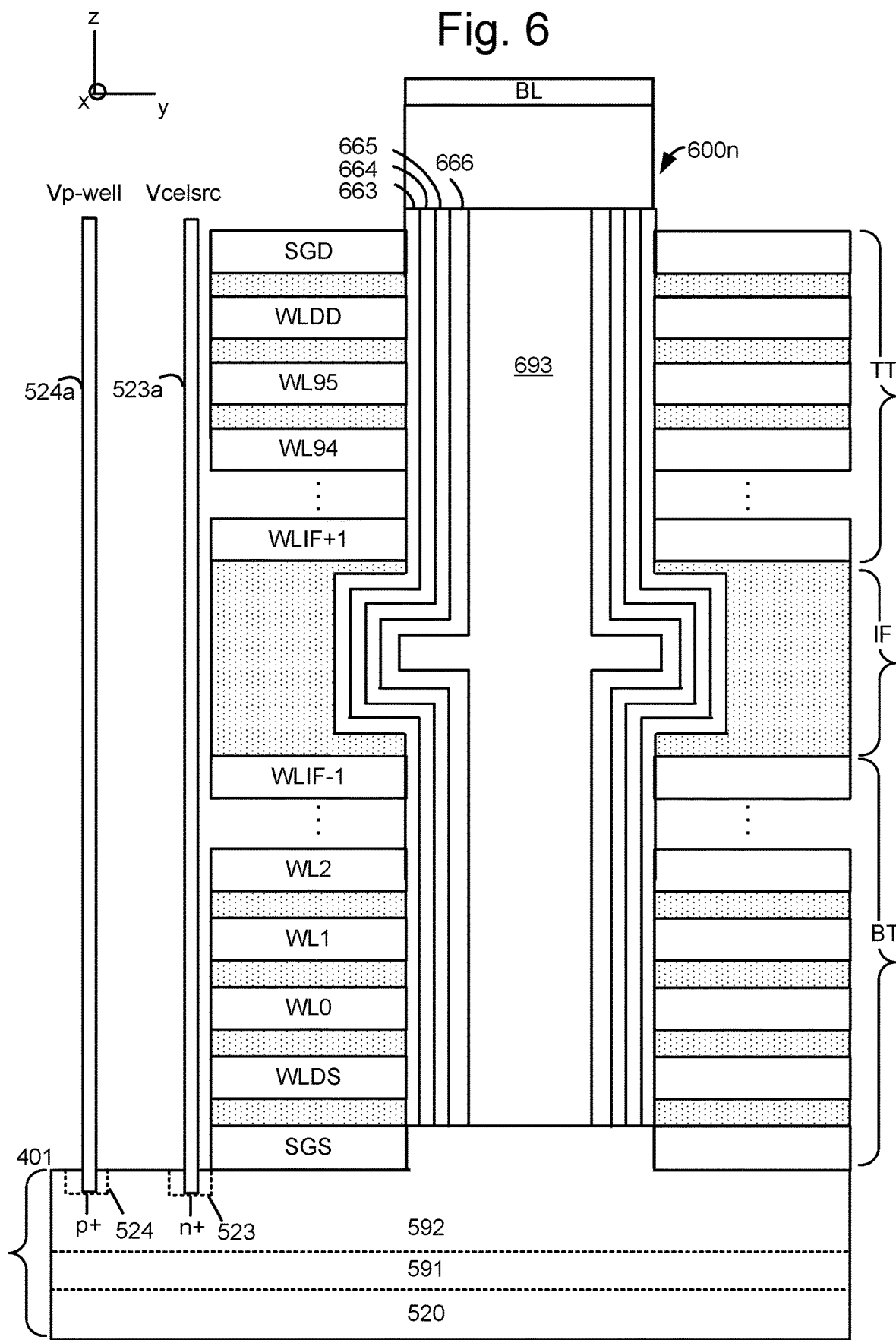

Fig. 7A
Fig. 7B
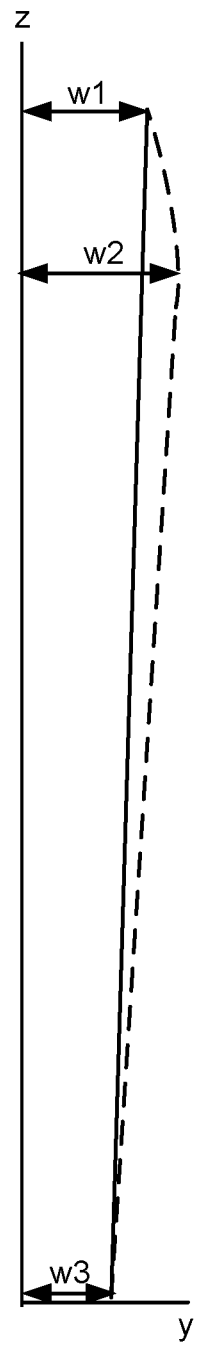
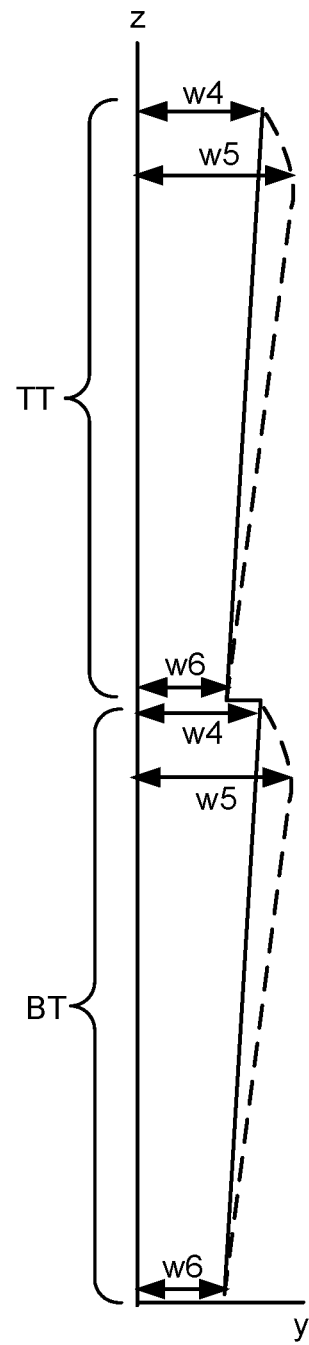

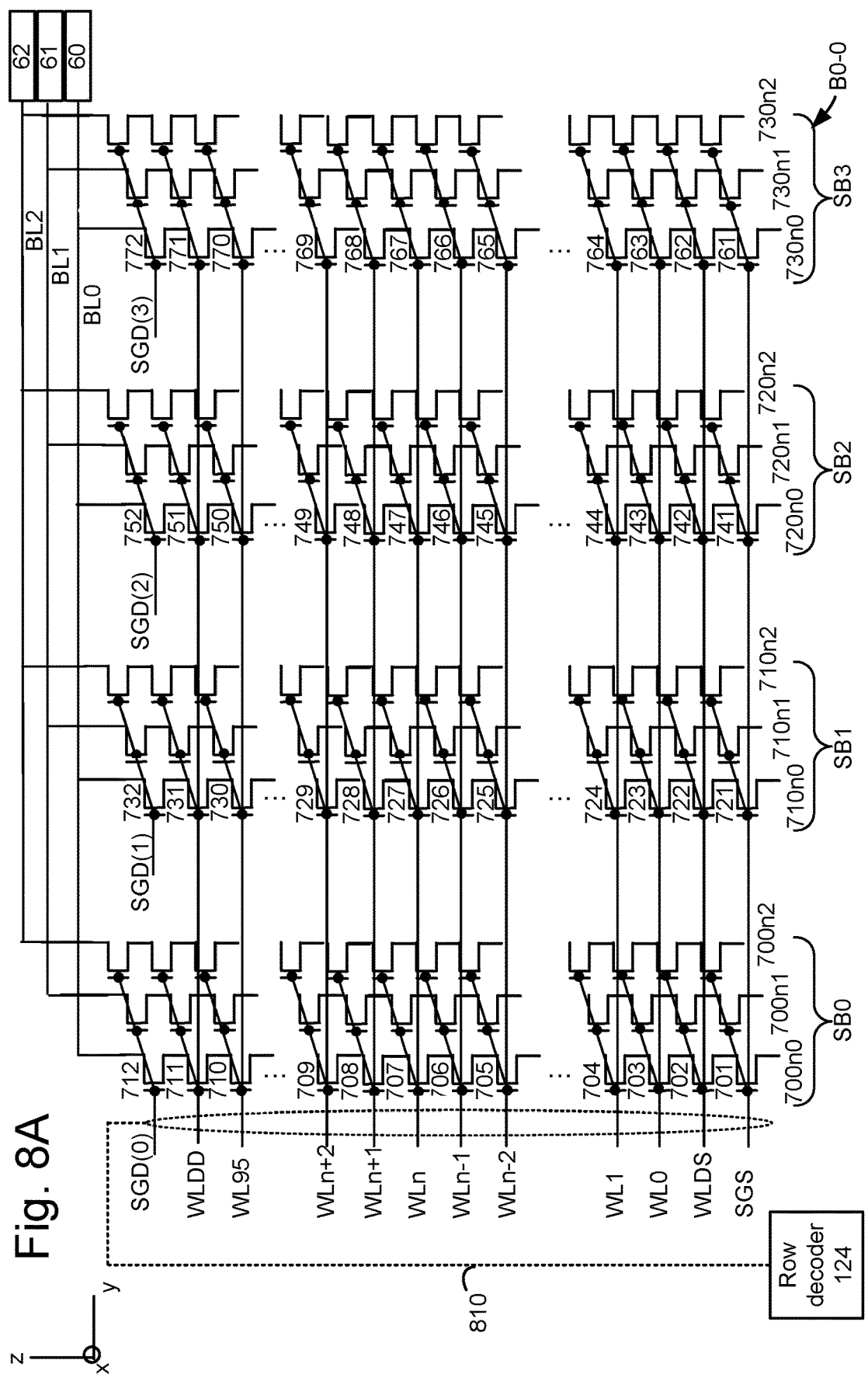

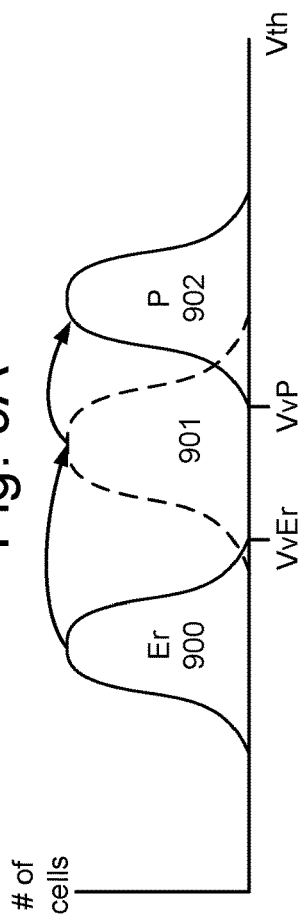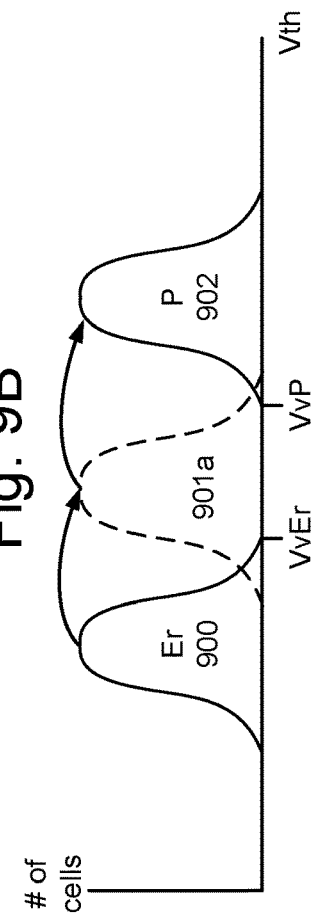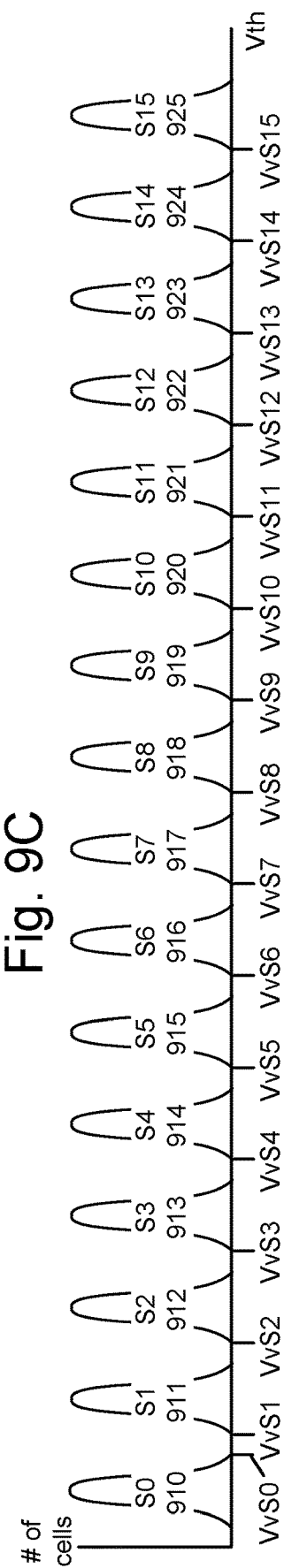

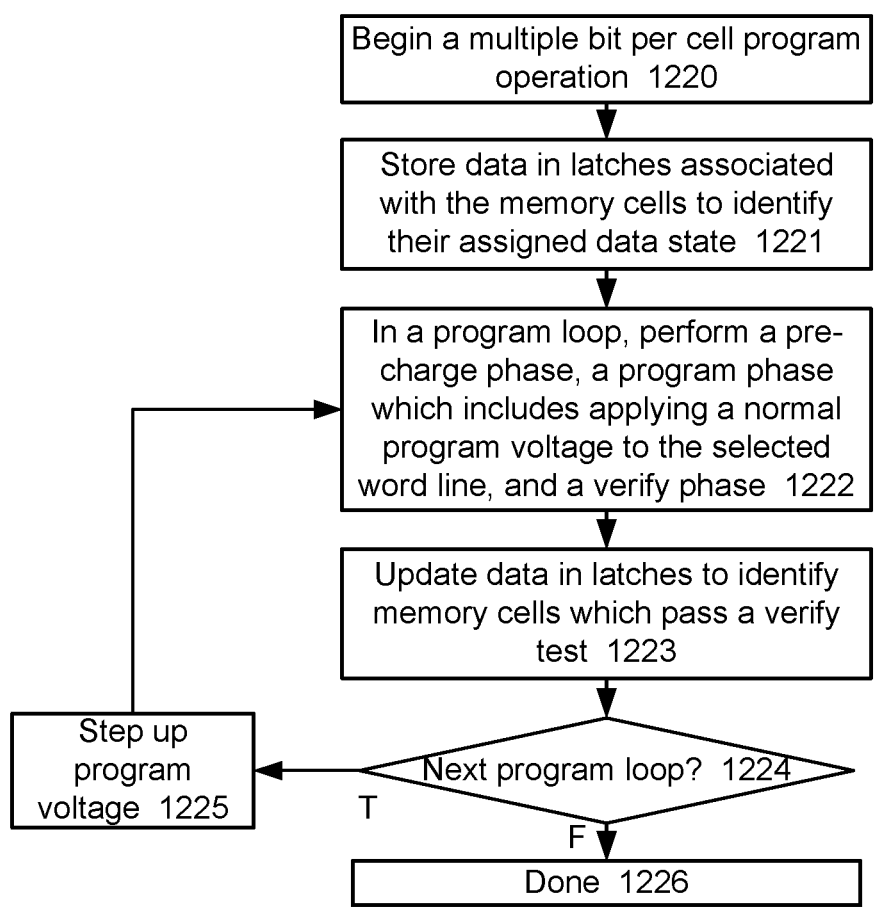

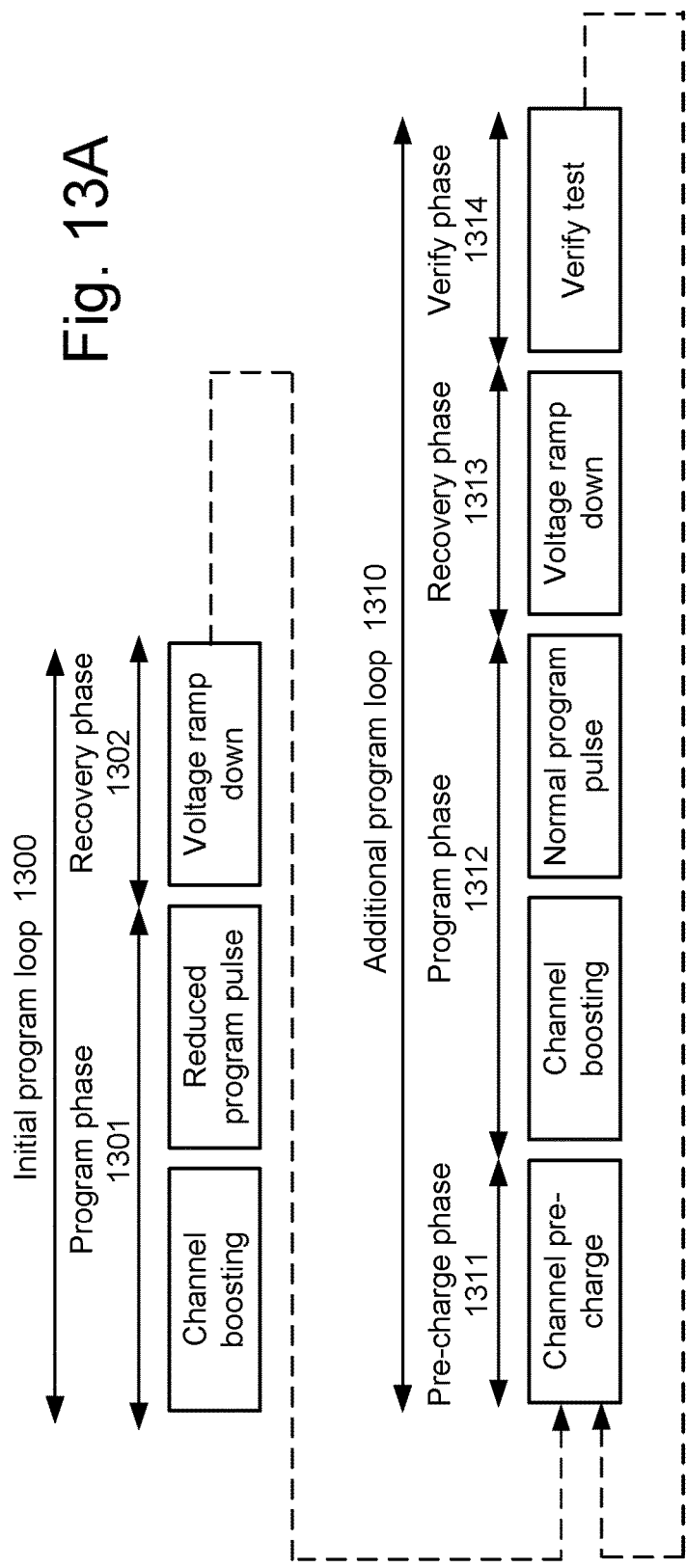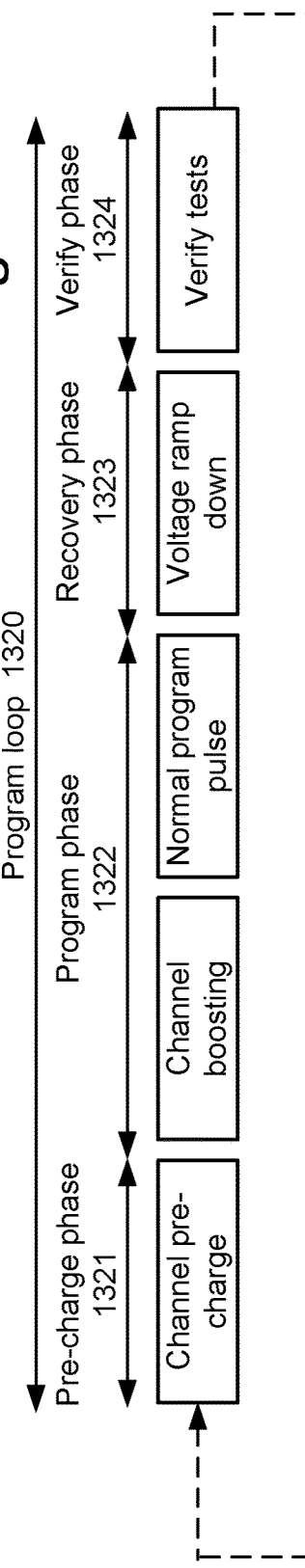

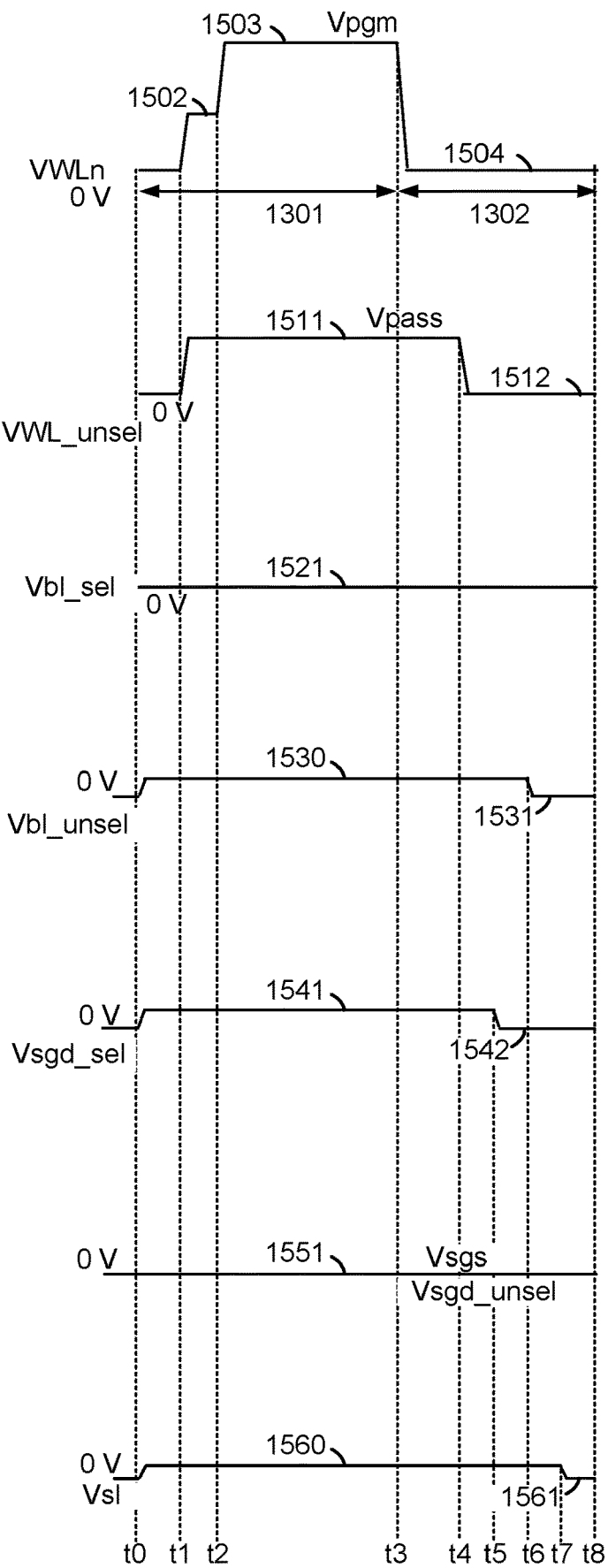

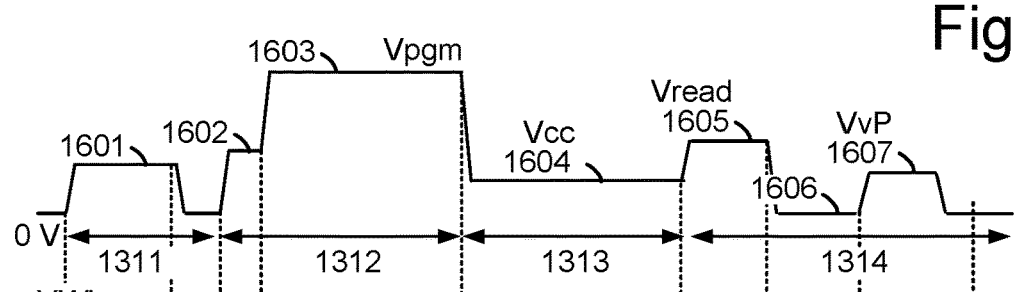
Fig. 16A
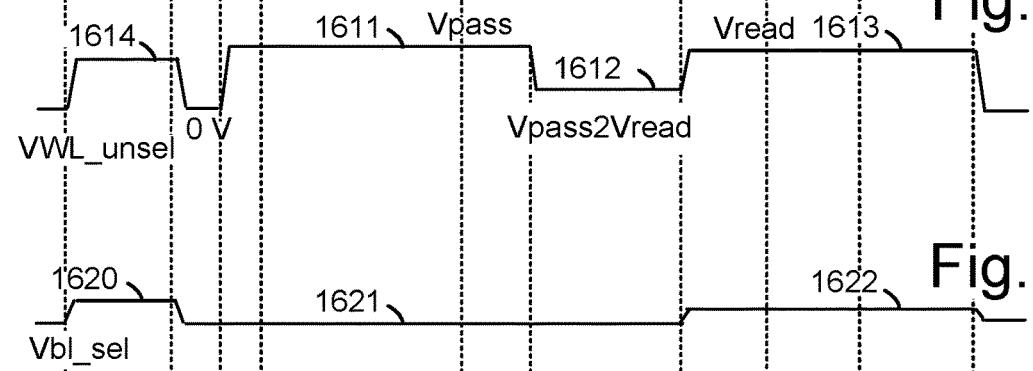
Fig. 16B
Fig. 16C
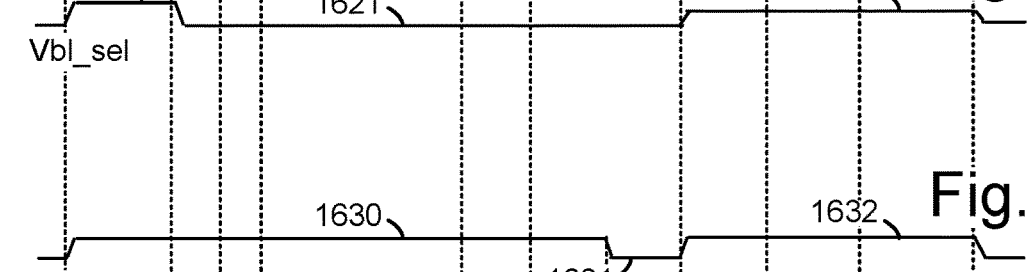
Fig. 16D
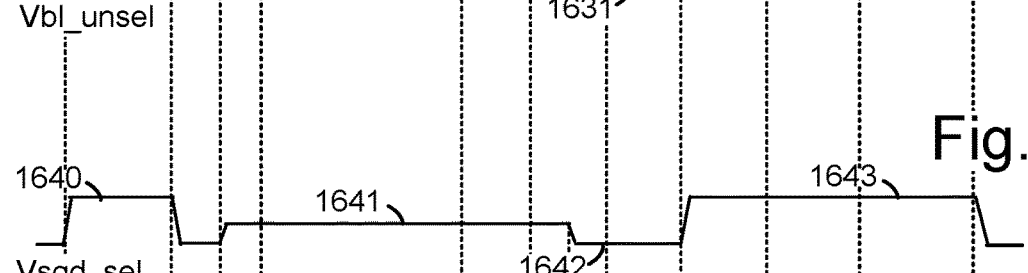
Fig. 16E
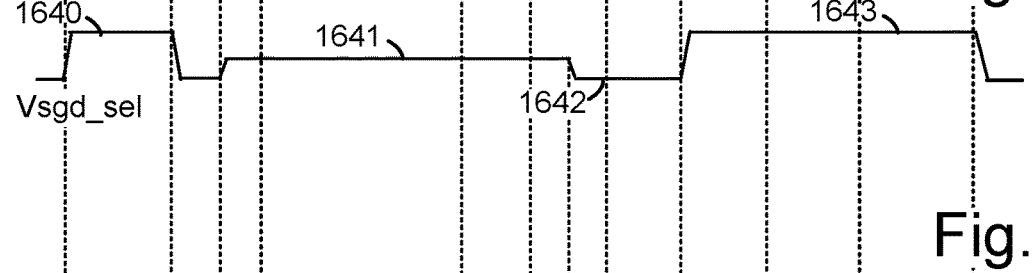
Fig. 16F
Fig. 16G
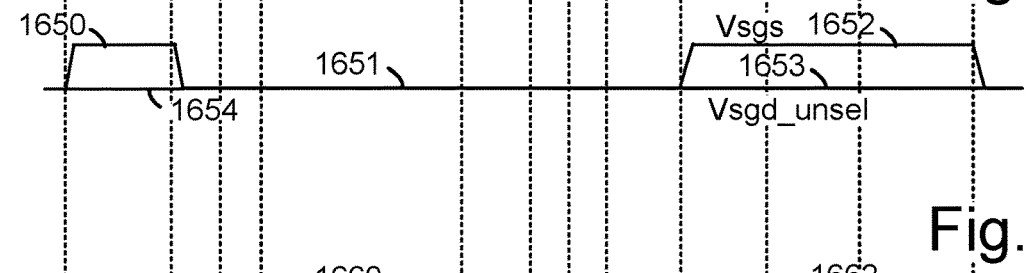

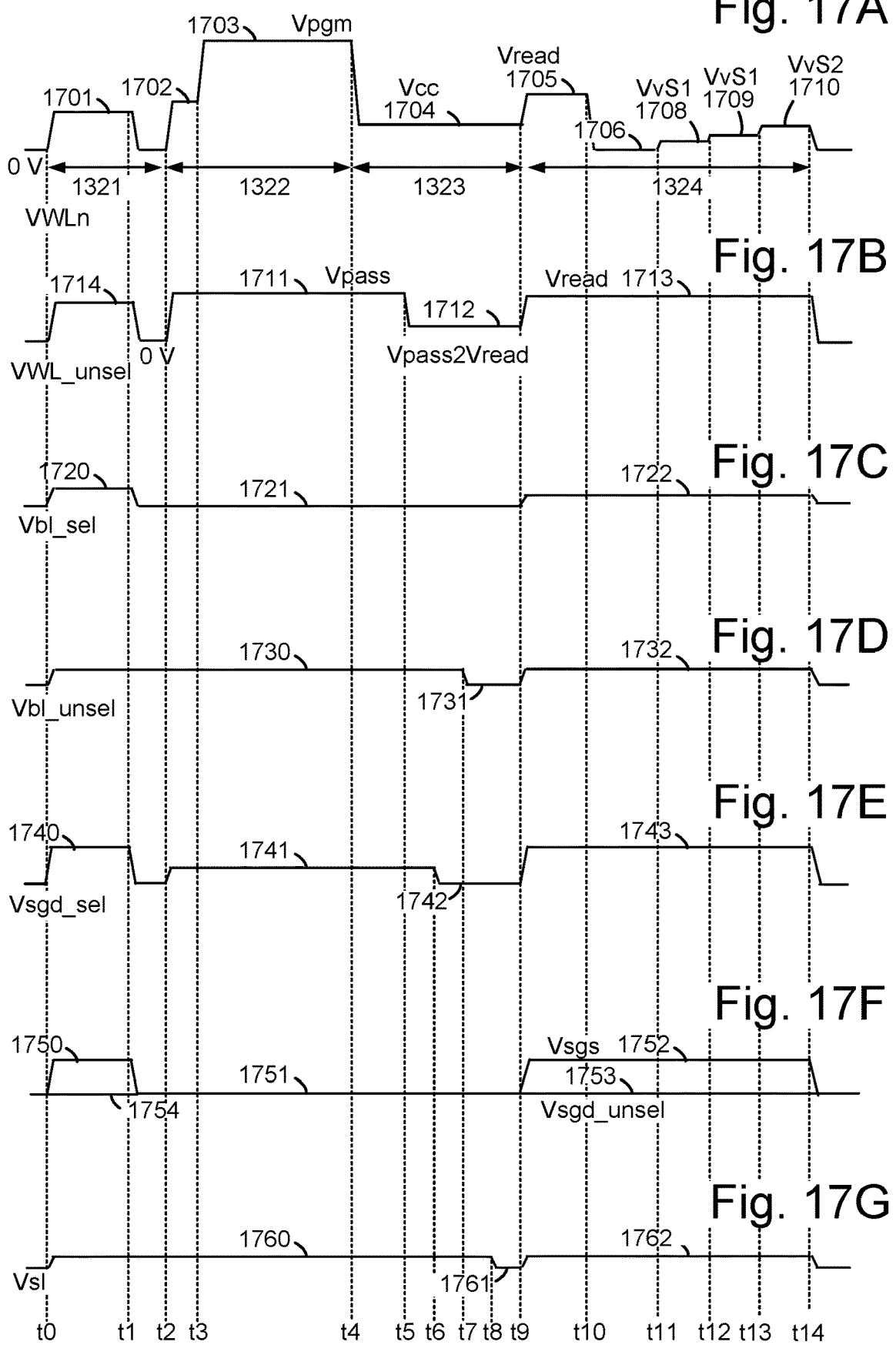

Fig. 18A

| Er | P |
|---|---|
| 1 | 0 |

Fig. 18B

|  | S0/Er | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| UP  | 1 | 0 | 0 | 0 | 0 | 0 | 0 | 0 | 0 | 1 | 1 | 1 | 1 | 1 | 1 | 1 |
| UMP | 1 | 0 | 0 | 0 | 0 | 1 | 1 | 1 | 1 | 0 | 0 | 0 | 0 | 1 | 1 | 1 |
| LMP | 1 | 0 | 0 | 1 | 1 | 0 | 0 | 1 | 1 | 0 | 0 | 1 | 1 | 0 | 0 | 1 |
| LP  | 1 | 0 | 1 | 0 | 1 | 0 | 1 | 0 | 1 | 0 | 1 | 0 | 1 | 0 | 1 | 0 |

OPTIMIZED PROGRAMMING WITH A SINGLE BIT PER MEMORY CELL AND MULTIPLE BITS PER MEMORY CELL

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 6 depicts another example cross-sectional view of a portion of the block B0-0 of FIG. 4, including a NAND string 600n, where the block comprises two tiers.

FIG. 7A depicts example plots of memory hole width versus height in the NAND string 700n0 of FIG. 5A.

FIG. 7B depicts example plots of memory hole width versus height in the NAND string 600n of FIG. 6.

FIG. 8A depicts an example view of the block B0-0 of FIG. 4, with respective NAND strings arranged in sub-blocks, along with associated bit lines and sense circuits.

FIG. 9A depicts example of Vth distributions in an SLC program operation, with two data states, consistent with the voltage signal of FIG. 10A.

FIG. 9B depicts another example of Vth distributions in an SLC program operation, with two data states, consistent with the voltage signal of FIGS. 14A and/or 14B.

FIG. 9C depicts example Vth distributions in an MLC program operation, with sixteen data states, consistent with the voltage signal of FIG. 10B.

FIG. 12C depicts a flowchart of an example MLC program operation, consistent with FIG. 12A, step 1202.

FIG. 13A depicts an example SLC program sequence, consistent with FIGS. 12B, 14A-14C, 15A-15G and 16A-16G.

FIG. 13B depicts an example MLC program sequence, consistent with FIGS. 12C, and 17A-17G.

FIG. 15A depicts voltages applied to a selected word line, WLn in a program loop of a program operation, consistent with the initial program loop 1300 of the SLC program sequence of FIG. 13A.

FIG. 15B depicts a voltage, VWL_unsel, applied to unselected word lines, consistent with FIG. 15A.

FIG. 15C depicts a voltage, Vbl_sel, applied to bit lines of selected NAND strings, consistent with FIG. 15A.

FIG. 15D depicts a voltage, Vbl_unsel, applied to bit lines of inhibited NAND strings, consistent with FIG. 15A.

FIG. 15E depicts a voltage, Vsgd_sel, applied to SGD transistors of a selected sub-block in which programming occurs, consistent with FIG. 15A.

FIG. 15F depicts voltages applied to SGD transistors of unselected sub-blocks and to SGS transistors, consistent with FIG. 15A.

FIG. 15G depicts a voltage applied to a source line, consistent with FIG. 15A.

FIG. 16A depicts voltages applied to a selected word line, WLn in a program loop of a program operation, consistent with the additional program loop 1310 of the SLC program sequence of FIG. 13A.

FIG. 16B depicts a voltage, VWL_unsel, applied to unselected word lines, consistent with FIG. 16A.

FIG. 16C depicts a voltage, Vbl_sel, applied to bit lines of selected NAND strings, consistent with FIG. 16A.

FIG. 16D depicts a voltage, Vbl_unsel, applied to bit lines of inhibited NAND strings, consistent with FIG. 16A.

FIG. 16E depicts a voltage, Vsgd_sel, applied to SGD transistors of a selected sub-block, consistent with FIG. 16A.

FIG. 16F depicts voltages applied to SGD transistors of unselected sub-blocks and to SGS transistors, consistent with FIG. 16A.

FIG. 16G depicts a voltage applied to a source line, consistent with FIG. 16A.

FIG. 17A depicts voltages applied to a selected word line, WLn in a program loop of a program operation, consistent with the program loop 1320 of the MLC program sequence of FIG. 13B.

FIG. 17B depicts a voltage, VWL_unsel, applied to unselected word lines, consistent with FIG. 17A.

FIG. 17C depicts a voltage, Vbl_sel, applied to bit lines of selected NAND strings, consistent with FIG. 17A.

FIG. 17D depicts a voltage, Vbl_unsel, applied to bit lines of inhibited NAND strings, consistent with FIG. 17A.

FIG. 17E depicts a voltage, Vsgd_sel, applied to SGD transistors of a selected sub-block, consistent with FIG. 17A.

FIG. 17F depicts voltages applied to SGD transistors of unselected sub-blocks and to SGS transistors, consistent with FIG. 17A.

FIG. 17G depicts a voltage applied to a source line, consistent with FIG. 17A.

FIG. 18A depicts an example of latch data during SLC programming, consistent with FIG. 12B, step 1211 and 1214.

FIG. 18B depicts an example of latch data during MLC programming, consistent with FIG. 12C, step 1221 and 1223.

DETAILED DESCRIPTION

Figure 1A:
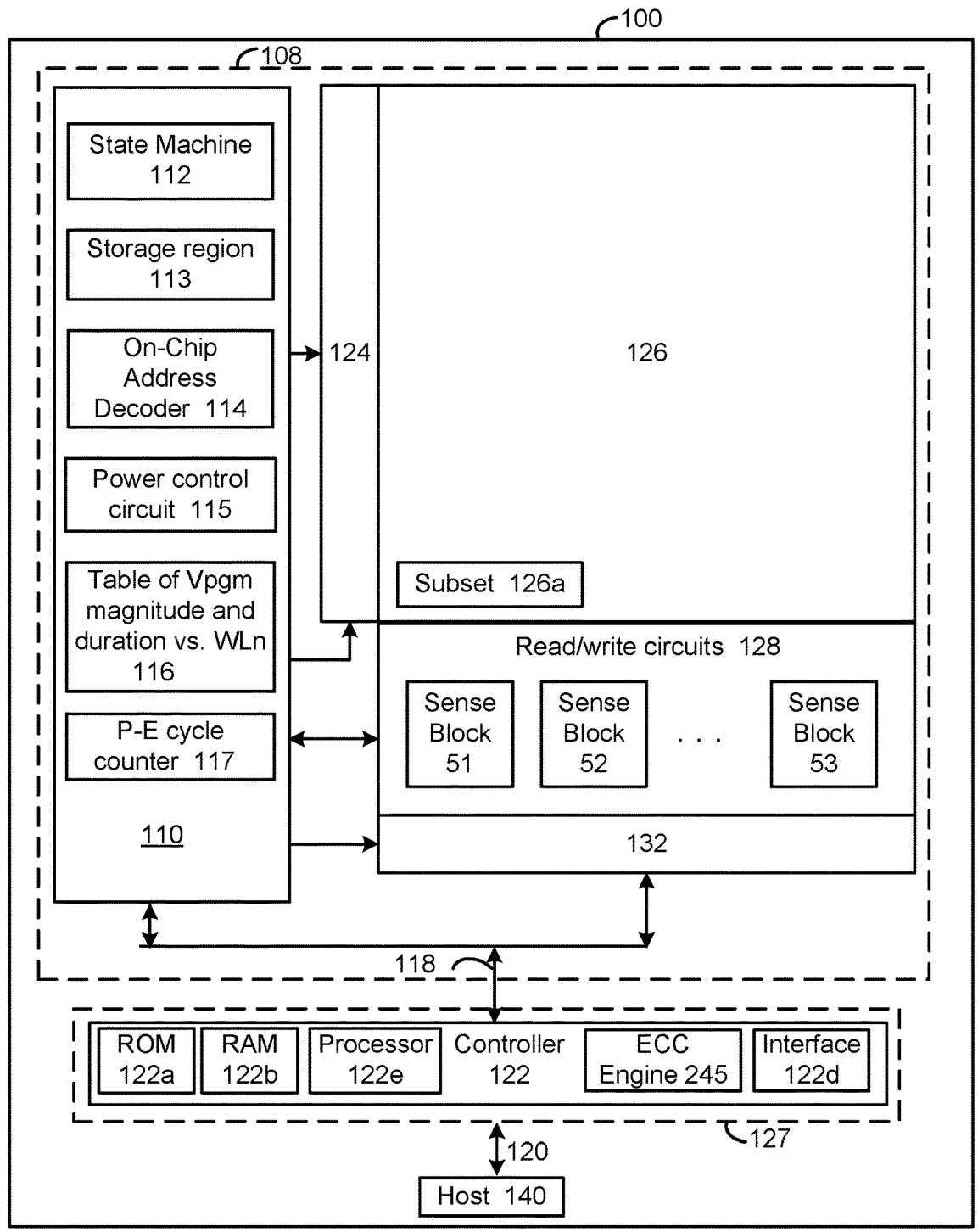
FIG. 1A is a block diagram of an example memory device.

Apparatuses and techniques are described for optimizing programming in a memory device in which memory cells can be programmed using single bit per cell programming and multiple bits per cell programming.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 8A, for example. Memory cells can be connected in other ways as well.

In one approach, the memory cells connected to a selected word line (WLn) in the set of word lines are programmed in a program operation.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5A and 6, for example.

The memory cells can be programmed to have a threshold voltage (Vth) which corresponds to a data state. In one approach, the memory cells are programmed using single level cell (SLC) or single bit per cell programming. In this case, the Vth of a cell either remains at a level of an erased (Er) state to represent one bit value such as a logical 1, or is programmed higher to a level of a programmed (P) state to represent another bit value such as a logical 0. See FIGS. 9A and 18A, for example. In one approach, the memory cells are programmed using multiple level cell (MLC) or multiple bits per cell programming. In this case, the Vth of a cell either remains at a level of an erased (S0) state to represent one set of bits, or is programmed higher to one or a number of higher levels of programmed states (e.g., S1-S15) to represent other sets of bit values. See FIGS. 9B and 18B, for example. Examples of MLC programming include TLC (three level cell) with three bits per cell and QLC (quad level cell) with four bits per cell.

The Vth is a function of an amount of charge stored in a charge storing material of the memory cell. A read operation can then be performed to determine the Vth and therefore the data state of a memory cell.

In some cases, a set of memory cells such as a block of memory cells, can cycle between SLC and MLC modes, depending on the needs of the memory device. The SLC mode generally provides more reliable storage while the MLC programming provides higher density storage. Moreover, the memory cells can have different reliability characteristics in the different modes. For example, data retention can vary. Data retention refers to the ability of the memory cells to retain their Vth level over time. A data retention loss is represented by a Vth downshift. Data retention can worsen due to damage to the cells as program-erase (P-E) cycles accumulate. As a result, the number of P-E cycles of a set of memory cells is limited. Further, a limit may be imposed on a ratio of a number of P-E cycles in SLC mode relative to a number of P-E cycles in MLC mode.

Techniques provided herein address the above and other issues by providing a time saving and wear reduction countermeasure. In one aspect, a SLC program operation is performed which reduces damage to the memory cells as well as reducing program time. This program operation can omit a pre-charge phase and a verify phase of an initial program loop of a program operation. Instead, a program phase is performed in which the program pulse magnitude and/or duration is reduced compared to subsequent program loops. A recovery phase is also performed after the program phase. For example, see the initial program loop 1300 of FIG. 13A. In one or more subsequent program loops of the SLC program operation, the program loop includes a pre-charge phase 1311 and a verify phase 1314 in addition to the program phase 1301 and the recovery phase 1302. For example, see the additional program loop 1310 of FIG. 13A.

The purpose of the pre-charge phase is to provide a small amount of channel boosting in the unselected NAND strings. This boosting is augmented by the capacitive coupling up of the channel which occurs during the program phase when the unselected word line voltages increase to a relatively high pass voltage, Vpass. See, e.g., the pre-charge phase 1311 of FIG. 16A-16G. The channel boosting helps prevent program disturb of the memory cells connected to WLn in the unselected NAND string by increasing the channel voltage and thereby decreasing the gate-to-channel voltage during the application of the program pulse. In the techniques described herein, although the pre-charge phase is omitted in the initial program loop, the risk of program disturb is reduced by using a program pulse magnitude and/or duration which is reduced compared to subsequent program loops.

When an MLC program operation is performed, the pre-charge phase 1321, program phase 1322, recovery phase 1323 and verify phase 1324 can be used in each of the program loops, such as depicted in FIG. 13B and FIG. 17A-17G, since MLC programming generally requires greater accuracy in the programming of the Vth levels of the memory cells to the multiple programmed data states, compared to SLC programming which has just one programmed state.

By omitting the pre-charge phase and the verify phase of the initial program loop during an SLC program operation, the program time is reduced. Moreover, the ratio of SLC P-E cycles compared to MLC P-E cycles can be increased since damage is reduced during the SLC programming. For example, see FIG. 11A, which shows how Vth margin is improved as P-E cycles increase. The techniques therefore provide a time saving and wear reduction countermeasure.

In one option, a magnitude of the program pulse or program voltage signal in the initial SLC program loop is based on a position of the selected word line in a set of word lines. For example, a magnitude of the program voltage signal in the initial SLC program loop can be an increasing function of a height of the selected word line above a substrate. For example, see FIG. 11A.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a table 116 of Vpgm magnitude and duration vs. WLn, and a P-E cycle counter. The table 116 can be used to adjust the program pulse magnitude and/or duration in the first program loop of an SLC program operation as a function of the selected word line WLn, such as depicted in FIG. 11B. The P-E cycle counter can count SLC and/or MLC P-E cycles to determine when to take a particular action. For example, when the number of SLC P-E cycles exceeds a threshold, the memory device can begin using the time saving initial program loop 1300 (FIG. 13A) during SLC programming. When the number of SLC P-E cycles does not exceed the threshold, the memory device can use the procedure of the additional program loop 1310 (FIG. 13A) during SLC programming for each program loop of a program operation, including the initial program loop.

A storage region 113 may also be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, table 116, P-E cycle counter 117, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122*e*, memory such as ROM 122*a* and RAM 122*b* and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. For example, see FIG. 9. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. For example, see FIG. 5A. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
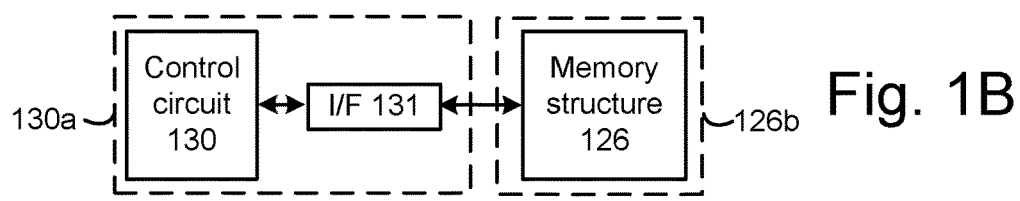
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
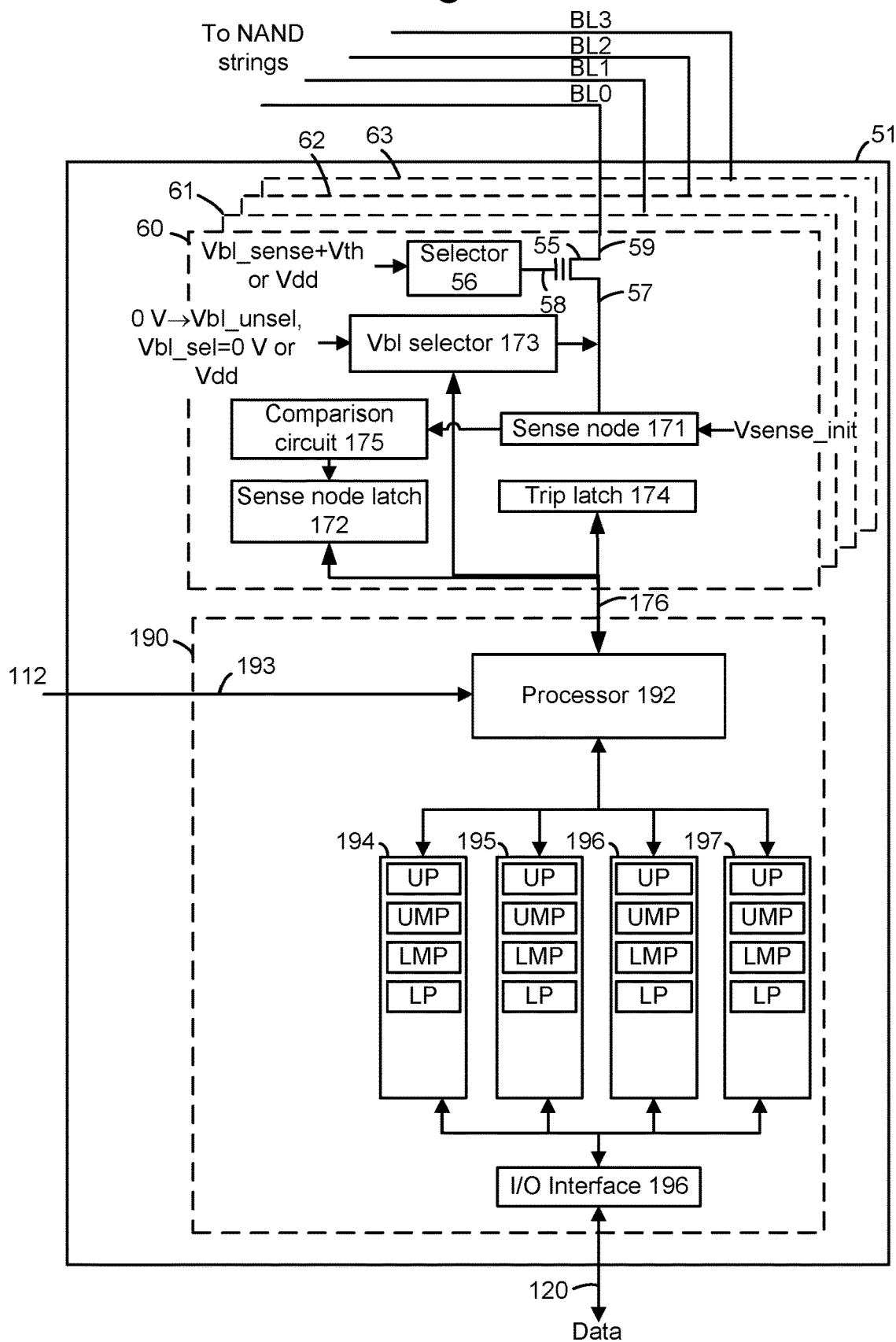
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 8A, each bit line is connected to four NAND strings,—one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl_selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_unsel for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four data latches, e.g., comprising individual latches LP, LMP, UMP and UP, can be provided for each sense circuit. When a set of memory cells is in a four bit per cell (QLC) mode, LP stores a bit for a lower page of data, LMP stores a bit for a lower-middle page of data, UMP stores a bit for an upper-middle page of data, and UP stores a bit for an upper page of data. See also FIG. 18B. In some cases, a different number of data latches may be used. For SLC programming, just one latch per sense circuit may be used, in one approach.

At the start of a program operation, the data latches identify the assigned data state of each memory cell. When a memory cell completes programming, its associated data latches can be set to identify the erased state so that it will be inhibited from further programming in any subsequent program loops of the program operation. See FIGS. 18A and 18B.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell.

As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

Figure 3:
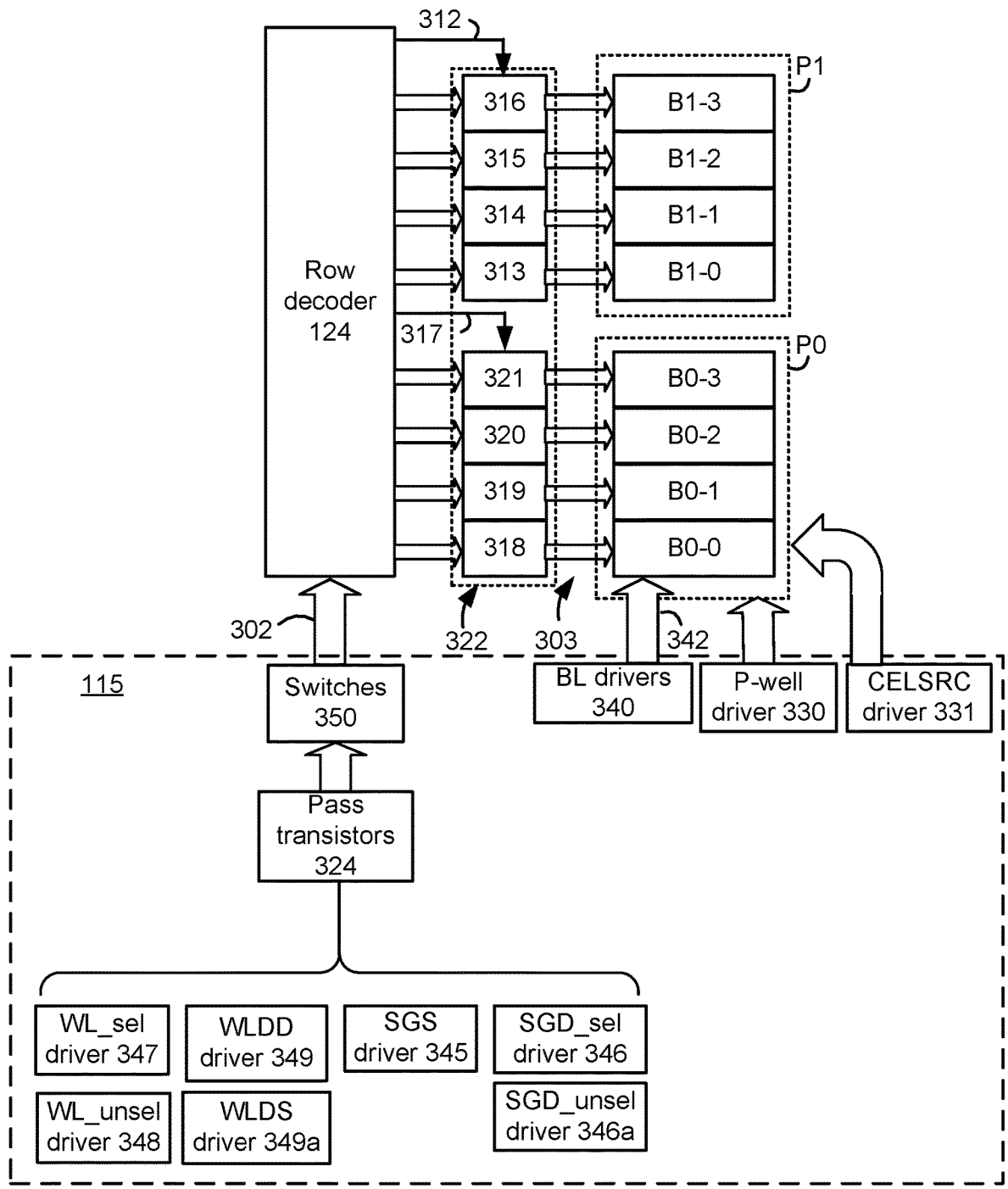
FIG. 3 depicts an example implementation of the power control circuit 115 of FIG. 1A for providing voltages to blocks of memory cells.

FIG. 3 depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8A. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B1-0 to B1-3, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. The WL_unsel driver 348 provides a voltage signal on unselected data word lines The WLDD driver 349 provides a voltage signal on the drain-side dummy word line, WLDD, and the WLDS driver 349*a* provides a voltage signal on the source-side dummy word line, WLDS.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346*a* for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524a. See FIG. 5A. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5A.

Bit line (BL) voltage drivers 340 include voltage sources which provide voltages to the bit lines 342. The bit line voltage for sensing can be 0.5 V, for example.

Figure 4:
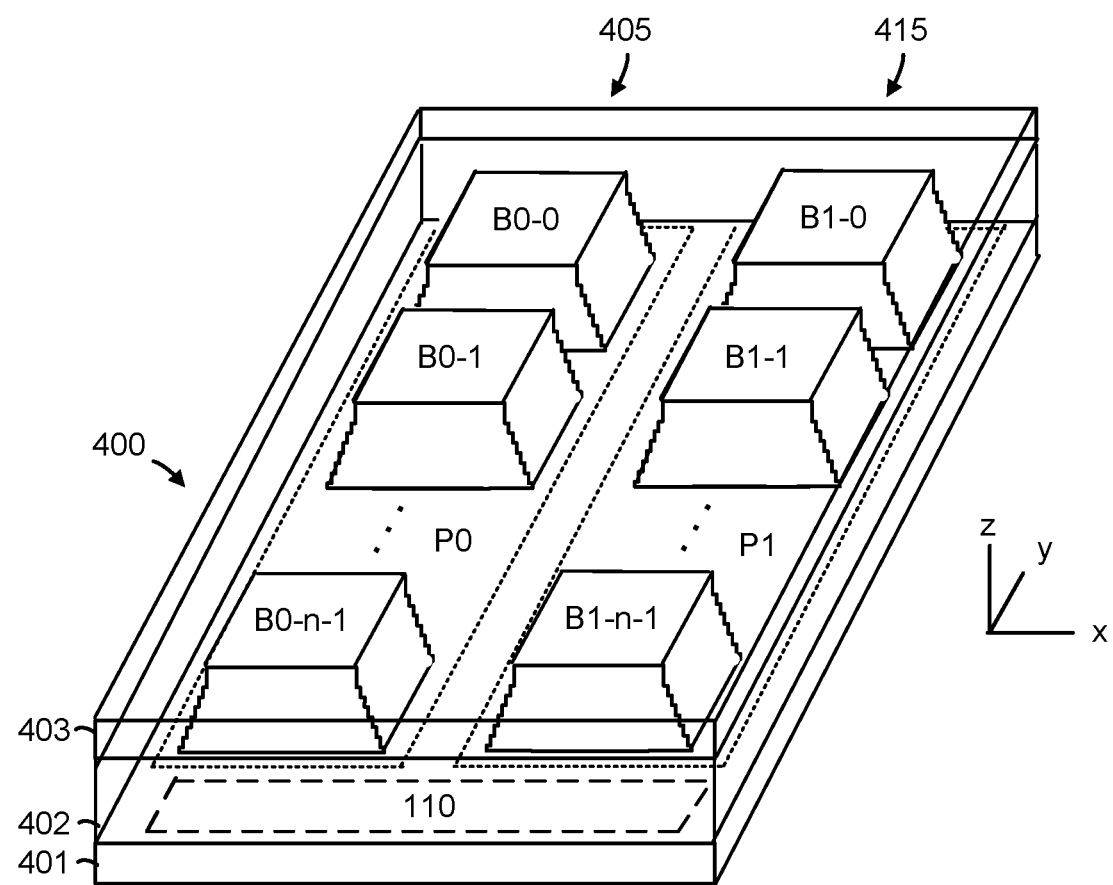
FIG. 4 is a perspective view of an example memory die 400 in which blocks are provided in respective planes P0 and P1, consistent with FIG. 3.

FIG. 4 is a perspective view of an example memory die 400 in which blocks are provided in respective planes P0 and P1, consistent with FIG. 3. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

Each block can be set in an SLC or MLC mode at various times based on the needs of the memory device. In some cases, the blocks are divided into groups, and each group comprising multiple blocks is set in an SLC or MLC mode.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5A:
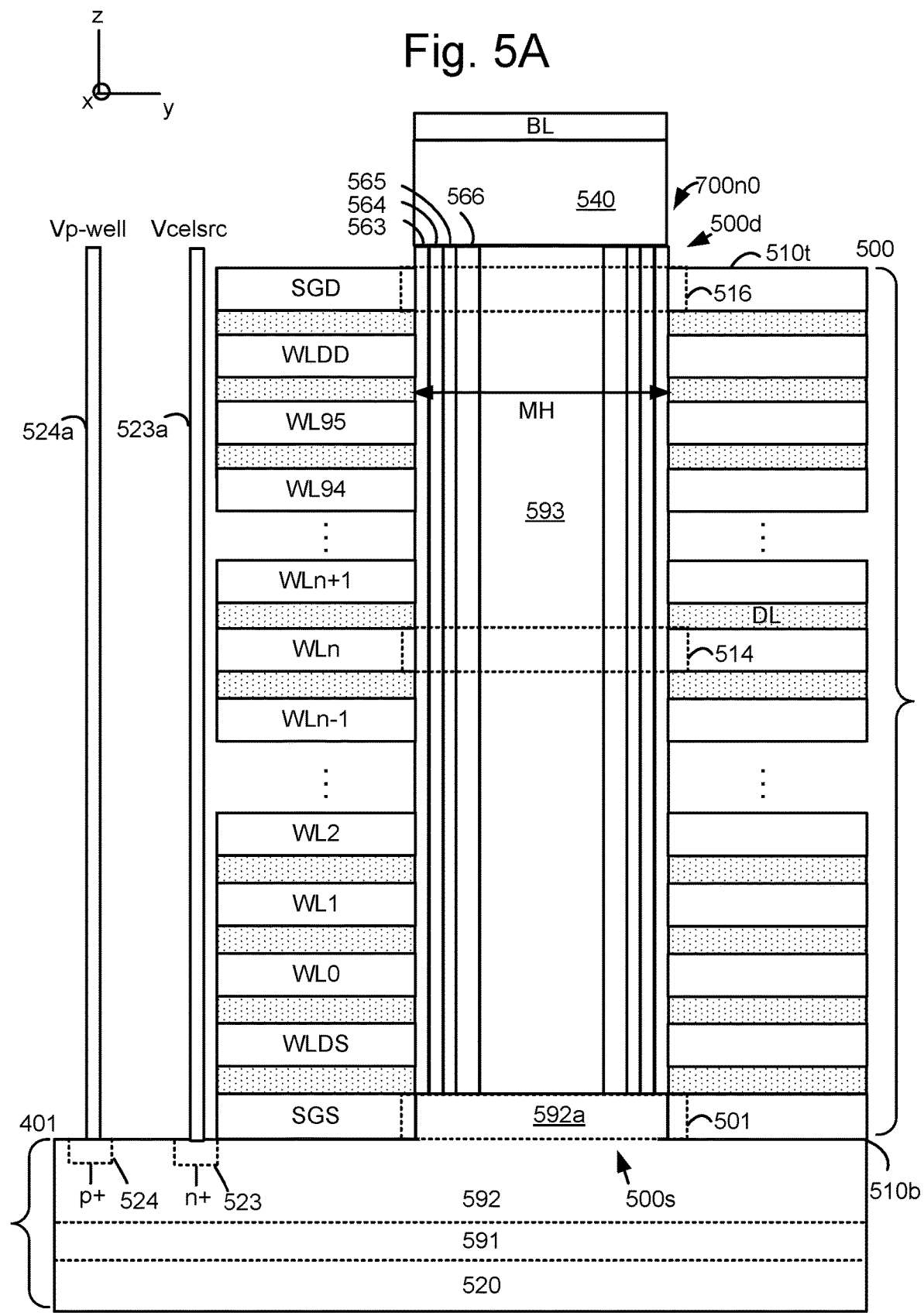
FIG. 5A depicts an example cross-sectional view of a portion of the block B0-0 of FIG. 4, including a NAND string 700n0.

The memory cells can be formed in vertical NAND strings in the blocks, consistent with FIG. 5A. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5A depicts an example cross-sectional view of a portion of the block B0-0 of FIG. 4, including a NAND string 700$n$0. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WL$n$–1, WL$n$, WL$n$+1, WL94, WL95, WLDD and SGD. WL$n$ denotes a selected word line for a read or program operation. The dielectric layers are shown by a dotted pattern and include an example dielectric layer DL. The conductive layers extend in a memory hole MH (see also FIG. 5B). The memory holes can have a varying width such as depicted in FIG. 7A.

The stack is depicted as comprising one tier but can optionally include one or more tiers of alternating conductive and dielectric layers. For example, see a stack comprising a bottom tier (BT) and a top tier (TT) in FIG. 6. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510$t$ and bottom 510$b$ of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WL$n$ intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 (see also FIG. 3) connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n0 has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 5B:
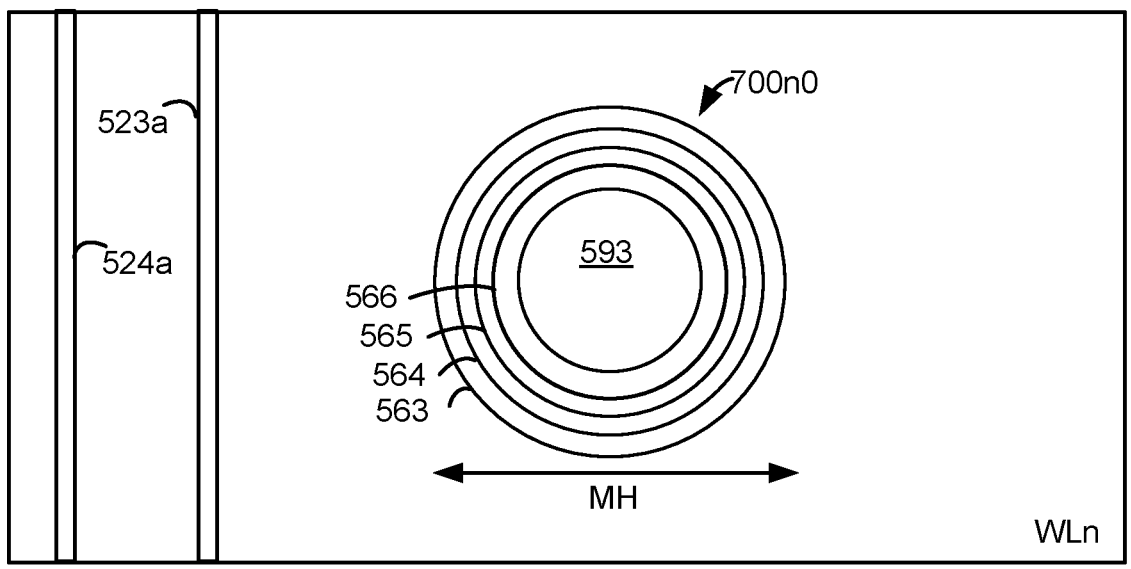
FIG. 5B depicts an example cross-sectional view of the block portion of FIG. 5A in the x-y plane at the level of WLn.

FIG. 5B depicts an example cross-sectional view of the block portion of FIG. 5A in the x-y plane at the level of WLn. The layers of the NAND string 700n0 are depicted, including the blocking oxide layer 563, charge-trapping layer 564, tunneling layer 565 and the channel layer 566. The dielectric core 593 is also depicted.

FIG. 6 depicts another example cross-sectional view of a portion of the block B0-0 of FIG. 4, including a NAND string 600n, where the block comprises two tiers. Like-numbered elements correspond to those in FIG. 5A. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. The memory holes can have a varying width such as depicted in FIG. 7B. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 in the BT, and WLIF+1 to WL95 in the TT, where WLIF−1 is the word line adjacent to and below the IF, and WLIF+1 is the word line adjacent to and above the IF. For example, when the bottom tier comprises WL0-WL47 and the top tier comprises WL48-WL95, WLIF−1=WL47 and WLIF+1=WL48. Optionally, the word lines adjacent to the IF are allocated as dummy word lines.

Additionally, the height of the IF is greater than the height of the remaining dielectric layers between the word lines. As a result, there is a reduced conductivity in the interface so it is more difficult for the electrons to move through the interface. This configuration can make the memory cells in the top or bottom tier more susceptible to a disturb. In some cases, the position of a memory cell (e.g., the position of a selected word line) within a tier affects the risk of a disturb.

FIG. 7A depicts example plots of memory hole width versus height in the NAND string 700n0 of FIG. 5A. The width of a memory hole can vary in the vertical direction due to variations in the etching process. The solid line depicts an example in which the width is progressively greater higher in the memory hole, starting from a width w3 at the bottom of the memory hole and ending at a width w1 at a top of the memory hole. The dashed line depicts an example in which the width is progressively greater higher in the memory hole, starting from the width w3 at the bottom of the memory hole until a width w2 is reached partway along the memory hole. The width then decreases to w1 at the top of the memory hole. This is an example of bowing, which results in an enlargement of the memory hole diameter at a mid-range region of the hole, between the top and bottom. Other examples of abnormal profiles include striation (a vertical scratch on the sidewall), distortion and twisting. For each selected word line, there will be an associated memory hole width which can affect the optimum program pulse magnitude and/or duration. For example, the magnitude and/or duration can be greater when the width is greater.

FIG. 7B depicts example plots of memory hole width versus height in the NAND string 600n of FIG. 6. The memory hole width for each tier is similar to the profile depicted in FIG. 7A. For the bottom tier (BT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the memory hole until a width w5 is reached partway along the bottom tier. The width then decreases to w4 at the top of the bottom tier.

For the top tier (TT), a solid line depicts an example in which the width is progressively greater higher in the memory hole, starting from a width w6 at the bottom of the tier and ending at a width w4 at a top of the tier. The dashed line depicts an example in which the width is progressively greater higher in the memory hole, starting from the width w6 at the bottom of the tier until a width w5 is reached partway along the top tier. The width then decreases to w4 at the top of the top tier.

During a program operation, the optimal program pulse width and/or duration can vary with the height of the selected word line and the associated memory hole width. See, e.g., FIG. 11B.

FIG. 8A depicts an example view of the block B0-0 of FIG. 4, with respective NAND strings arranged in sub-blocks, along with associated bit lines and sense circuits. The NAND strings are arranged in sub-blocks of the block in a 3D configuration. The block is consistent with FIG. 5A to 6. Each sub-block SB0-SB3 includes multiple NAND strings. Three example NAND strings are depicted, as a simplification. For example, SB0 comprises NAND strings 700n0, 700n1 and 700n2, SB1 comprises NAND strings 710n0, 710n1 and 710n2, SB2 comprises NAND strings 720n0, 720n1 and 720n2, and SB3 comprises NAND strings 730n0, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

Different sub-blocks can also have different susceptibilities to program or read disturbs due to other factors such as different distances from the row decoder and the corresponding different RC delays of a word line voltage signal.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells in between an SGS transistor and a SGD transistor, in this example. In other examples, more than one SGD and/or SGS transistor can be provided for each NAND string. The number of dummy memory cells can also vary. For example, the NAND string 700n0 includes an SGS transistor 701, a dummy memory cell 702, data memory cells 703-710, a dummy memory cell 711 and an SGD transistor 712. The NAND string 710n0 includes an SGS transistor 721, a dummy memory cell 722, data memory cells 723-730, a dummy memory cell 731 and an SGD transistor 732. The NAND string 720n0 includes an SGS transistor 741, a dummy memory cell 742, data memory cells 743-750, a dummy memory cell 751 and an SGD transistor 752. The NAND string 730n0 includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n0, 710n0, 720n0 and 730n0 in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

Figure 8B:
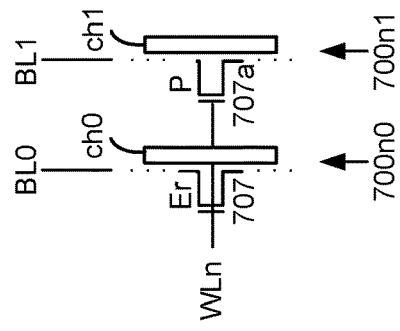
FIG. 8B depicts example NAND strings and memory cells in SB0 of FIG. 8A in an SLC program operation, including memory cells 707 and 707a assigned to an erased data state Er and to a programmed data state P, respectively.

FIG. 8B depicts example NAND strings and memory cells in SB0 of FIG. 8A in an SLC program operation, including memory cells 707 and 707a assigned to an erased data state Er and to a programmed data state P, respectively. The memory cells 707 and 707a are in NAND strings 700n0 and 700n1, respectively, which are connected to bit lines BL0 and BL1, respectively, via channels ch0 and ch1, respectively.

During a program loop, some of the NAND strings and memory cells may be selected for programming while others are unselected or inhibited. The unselected NAND strings may have their channels pre-charged when a pre-charge phase is used.

Figure 8C:
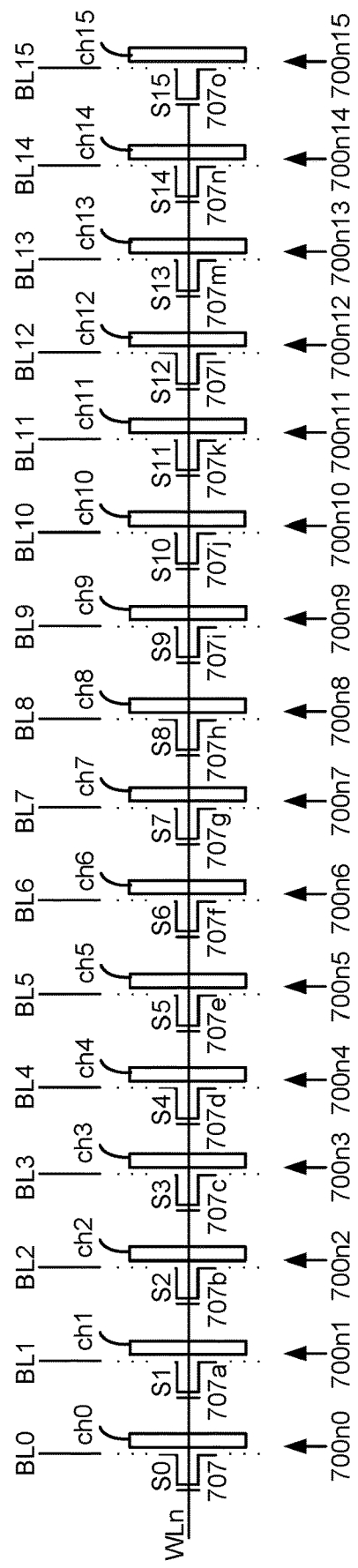
FIG. 8C depicts example NAND strings and memory cells in SB0 of FIG. 8A in an MLC program operation, including memory cells 707-707o assigned to data states S0-S15, respectively.

FIG. 8C depicts example NAND strings and memory cells in SB0 of FIG. 8A in an MLC program operation, including memory cells 707-707o assigned to data states S0-S15, respectively. The memory cells 707-707o are in NAND strings 700n0-700n15, respectively, which are connected to bit lines BL0-BL15, respectively, via channels ch0-ch15, respectively. In practice, the assigned data states are typically randomly distributed among the memory cells, but are shown here in a sequential order for simplicity.

During a program loop, some of the NAND strings and memory cells may be selected for programming while others are unselected or inhibited. The unselected NAND strings may have their channels pre-charged when a pre-charge phase is used. For example, over the course of the program operation, initially the NAND strings having memory cells assigned to the lower programmed states will be selected, while the NAND strings having memory cells assigned to the mid-range and higher data states are pre-charged. Subsequently, the NAND strings having memory cells assigned to the mid-range programmed states will be selected while the NAND strings having memory cells assigned to the lower and higher data states are pre-charged. Subsequently, the NAND strings having memory cells assigned to the higher programmed states will be selected while the NAND strings having memory cells assigned to the lower and mid-range data states are pre-charged.

In FIG. 9A-9C, the vertical axis depicts a number of memory cells on a logarithmic scale and the horizontal axis depicts Vth on a linear scale.

Figure 10A:
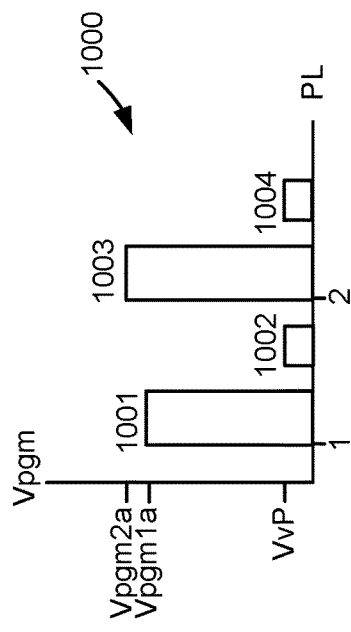
FIG. 10A depicts an example voltage signal 1000 in an SLC program operation, consistent with FIG. 9A.

FIG. 9A depicts example of Vth distributions in an SLC program operation, with two data states, consistent with the voltage signal of FIG. 10A. The erased (Er) state is represented by the Vth distribution 900, and the programmed state (P) is represented by the Vth distribution 902. In this example, the P-state memory cells are programmed to an intermediate Vth distribution 901 after an initial or first program loop of the program operation (such as by the program pulse 1001 of FIG. 10A), and to the final Vth distribution 902 after a subsequent, second program loop of the program operation (such as by the program pulse 1003 of FIG. 10A).

During an erase operation, the Vth of the memory cells is set below an erase-verify voltage VvEr. The erase operation is completed when all or nearly all of the memory cells have a Vth<VvEr. During the program operation, the Vth of the memory cells is set above a program-verify voltage VvP. The program operation is completed when all or nearly all of the memory cells have a Vth>VvP.

Figure 14A:
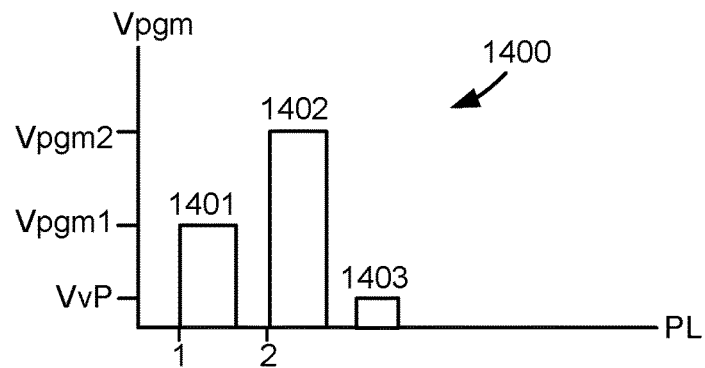
FIG. 14A depicts an example voltage signal 1400 in an SLC program operation consistent with FIG. 13A, where the first program pulse 1401 has a smaller magnitude but a same duration compared to the second program pulse 1402, the first program pulse 1401 is not followed by a verify pulse and the second program pulse 1402 is followed by a verify pulse (plot 1403).

FIG. 9B depicts another example of Vth distributions in an SLC program operation, with two data states, consistent with the voltage signal of FIGS. 14A and/or 14B. As in FIG.

9A, the erased (Er) state is represented by the Vth distribution 900, and the programmed state (P) is represented by the Vth distribution 902. The P-state memory cells are programmed to an intermediate Vth distribution 901a after an initial or first program loop of the program operation (such as by the program pulse 1401 of FIG. 14A or 1411 of FIG. 14B), and to the final Vth distribution 902 after a subsequent, second program loop of the program operation (such as by the program pulse 1402 of FIG. 14A or 1412 of FIG. 14B). Since the program pulses 1401 and 1411 have a smaller magnitude, and the pulse 1411 has a smaller duration compared to the program pulse 1001, the Vth distribution 901a is lower than the Vth distribution 901 in FIG. 9A.

Figure 10B:
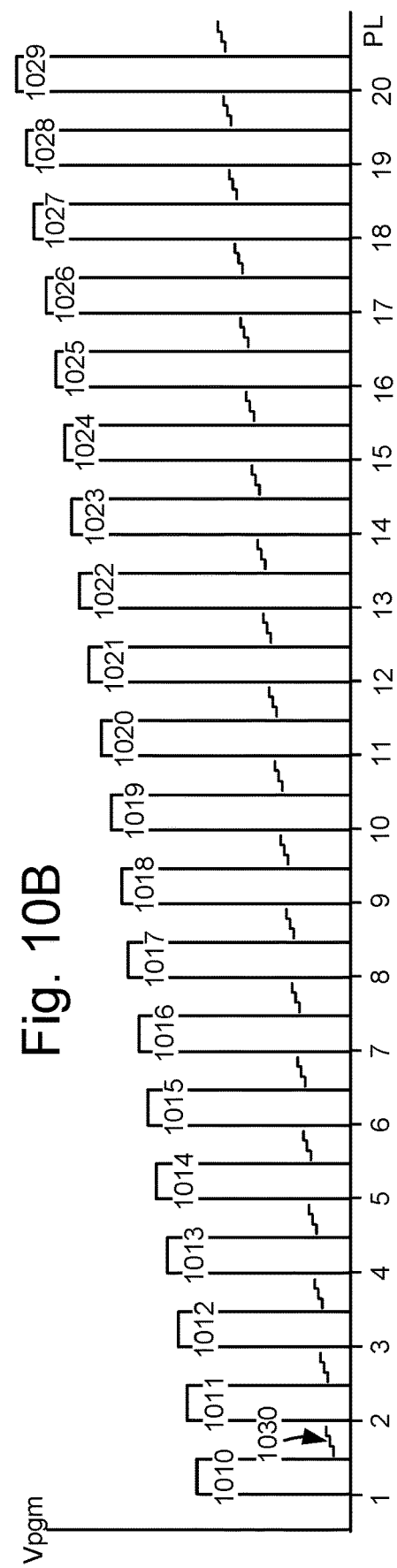
FIG. 10B depicts an example voltage signal 1050 in an MLC program operation, consistent with FIG. 9B.

FIG. 9C depicts example Vth distributions in an MLC program operation, with sixteen data states, consistent with the voltage signal of FIG. 10B. The data states includes the erased state S0 having an associated erase-verify voltage VvS0, and the programmed states S1-S15 having associated program-verify voltages VvS1-VvS15, respectively. The data states S0-S15 are represented by the Vth distributions 910-925, respectively. A voltage signal 1050 such as depicted in FIG. 10B can be used to program the memory cells. Typically, several program loops are used to obtain the Vth distributions. When a memory cell is verified to reach its assigned data state, it is inhibited from programming in the remaining program loops by applying an elevated bit line voltage to the respective NAND string during the program pulses of the remaining program loops.

The verify tests in the program loops can be set for progressively higher data states as the program operation proceeds, such as depicted in FIG. 10B.

In FIGS. 10A and 10B, the vertical axis denotes a program pulse voltage (Vpgm) on a linear scale and the horizontal axis denotes a program loop (PL) number.

FIG. 10A depicts an example voltage signal 1000 in an SLC program operation, consistent with FIG. 9A. In a first program loop, a program pulse 1001 with a magnitude of Vpgm1a is applied to the selected word line, followed by a verify pulse 1002 with a magnitude of VvP. In a second program loop, a program pulse 1003 with a magnitude of Vpgm2a is applied to the selected word line, followed by a verify pulse 1004 with the magnitude of VvP. In this example, the program operation is completed in the second program loop. SLC programming generally can be completed in a relatively small number of program loops, e.g., two or more loops, compared to MLC programming, since a wider Vth distribution for the programmed state, and a larger spacing between the erased state and the programmed state, are acceptable.

FIG. 10B depicts an example voltage signal 1050 in an MLC program operation, consistent with FIG. 9B. QLC programming, with four bits per cell, and sixteen data states, is provided as an example. Other types of MLC programming can be used. In this example, the voltage signal includes twenty program loops PL1-PL20 with program pulses 1010-1029, respectively, and associated verify voltages. For example, verify voltages (plot 1030) are provided in PL1. The verify voltages are depicted in a simplified form, and can be provided for progressively higher data states as the programming proceeds.

Figure 11A:
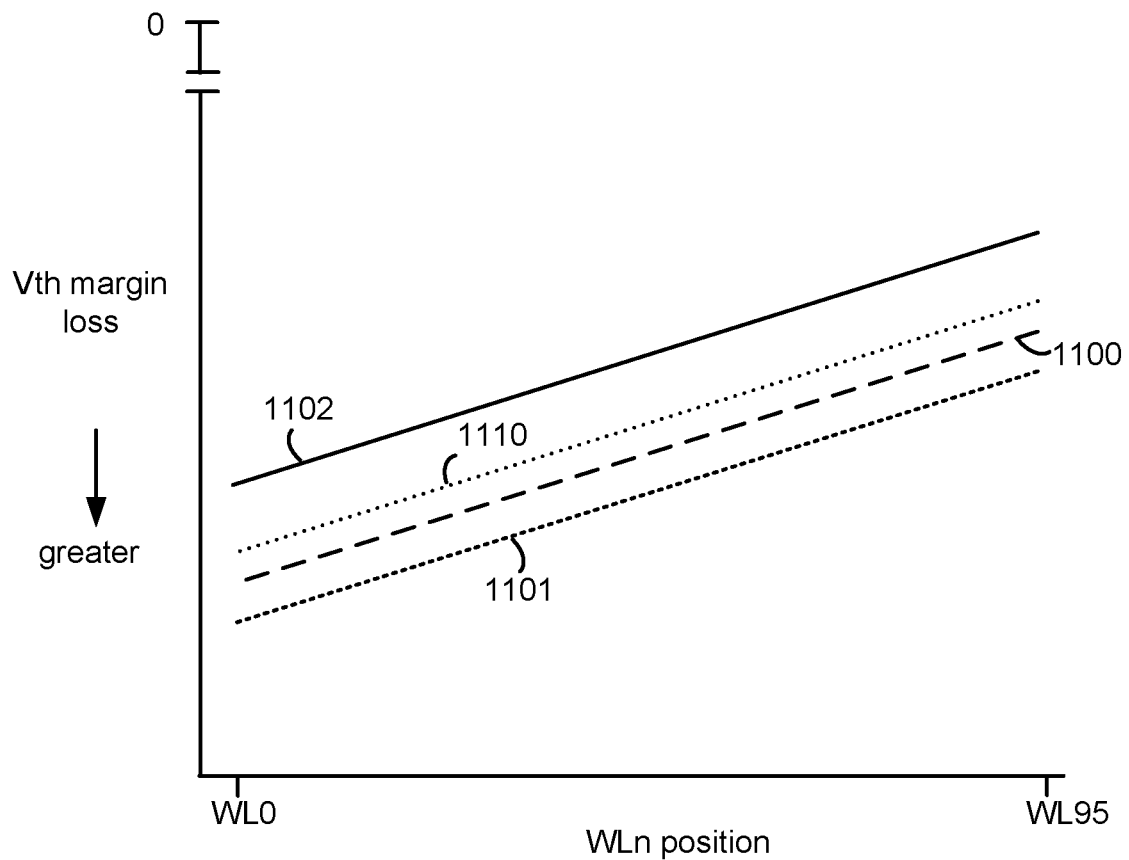
FIG. 11A depicts a plot of Vth margin loss vs. WLn position.
Figure 11B:
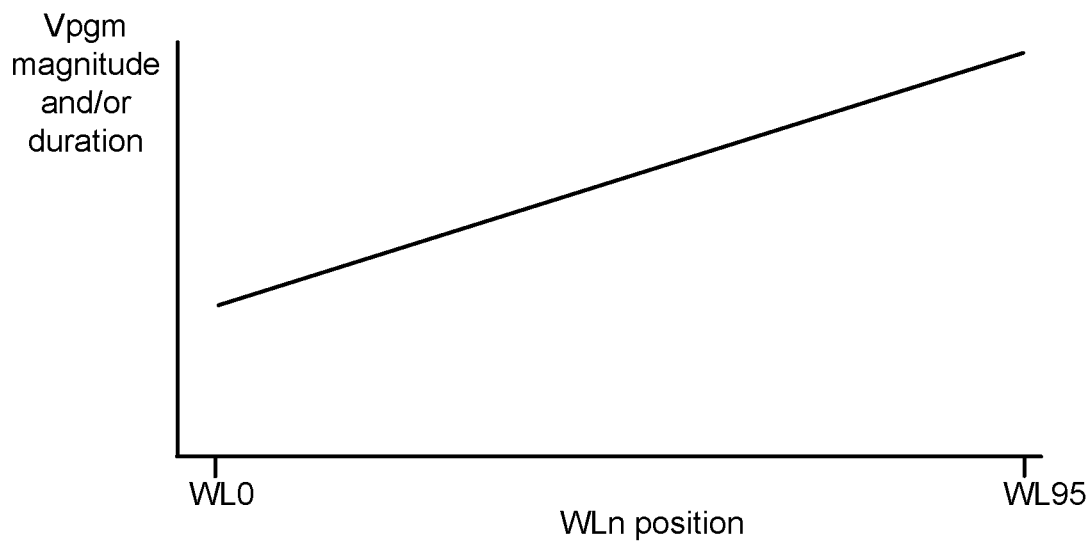
FIG. 11B depicts a plot of Vpgm magnitude and/or duration vs. WLn position, consistent with FIG. 11A.

FIG. 11A depicts a plot of Vth margin loss vs. WLn position. For a set of SLC memory cells, the Vth margin refers to the spacing between the Vth distributions of the erased and programmed data states such as in FIG. 9A or 9B. For a set of MLC memory cells, the Vth margin refers to the sum of the spacing between the Vth distributions of each of the data states such as in FIG. 9C. In either case, the Vth margin loss refers to a reduction in the Vth margin due to factors such as data retention loss. As the Vth margin loss becomes greater, the Vth distributions of the two data states become closer together so that the likelihood of a read error increases.

Plot 1100 depicts the case of SLC programming with a baseline program pulse magnitude (such as Vpgm1a in FIG. 10A) in the initial program loop. Plot 1101 depicts the case of SLC programming with a higher than baseline program pulse magnitude in the initial program loop. Plot 1102 depicts the case of SLC programming with a lower than baseline program pulse magnitude (such as Vpgm1 in FIG. 14A, Vpgm1b in FIG. 14B or Vpgm1c in FIG. 14C) in the initial program loop. Plot 1110 depicts the case of MLC programming. This data indicates Vth margin loss is reduced when the program pulse magnitude is reduced in the initial program loop of an SLC program operation. A similar result is expected when the program pulse duration is reduced.

Further, the plots indicate that the Vth margin loss generally increases as the WLn position is closer to the substrate, where WL0 is closest to the substrate and WL95 is furthest from the substrate, or highest in the block, consistent with FIG. 6. Accordingly, the program pulse magnitude and/or duration in the initial program loop of an SLC program operation can be lower when the WLn position is lower, or closer to the substrate, and higher when the WLn position is higher, or further from the substrate. Generally, the program pulse magnitude and/or duration can be a function of the WLn position among a set of word lines. In one approach, the word lines in the set of word lines are at different heights above a substrate, and a magnitude and/or duration of the program pulse in the initial program loop is an increasing function of a height of the selected word line above the substrate.

This approach helps tailor the program pulse magnitude to the WLn position.

FIG. 11B depicts a plot of Vpgm magnitude and/or duration vs. WLn position, consistent with FIG. 11A. As mentioned, the program pulse magnitude in the initial program loop of an SLC program operation can be lower when the WLn position is lower, or closer to the substrate. Similarly, the program pulse duration in the initial program loop of an SLC program operation can be lower when the WLn position is lower, or closer to the substrate.

Figure 11C:
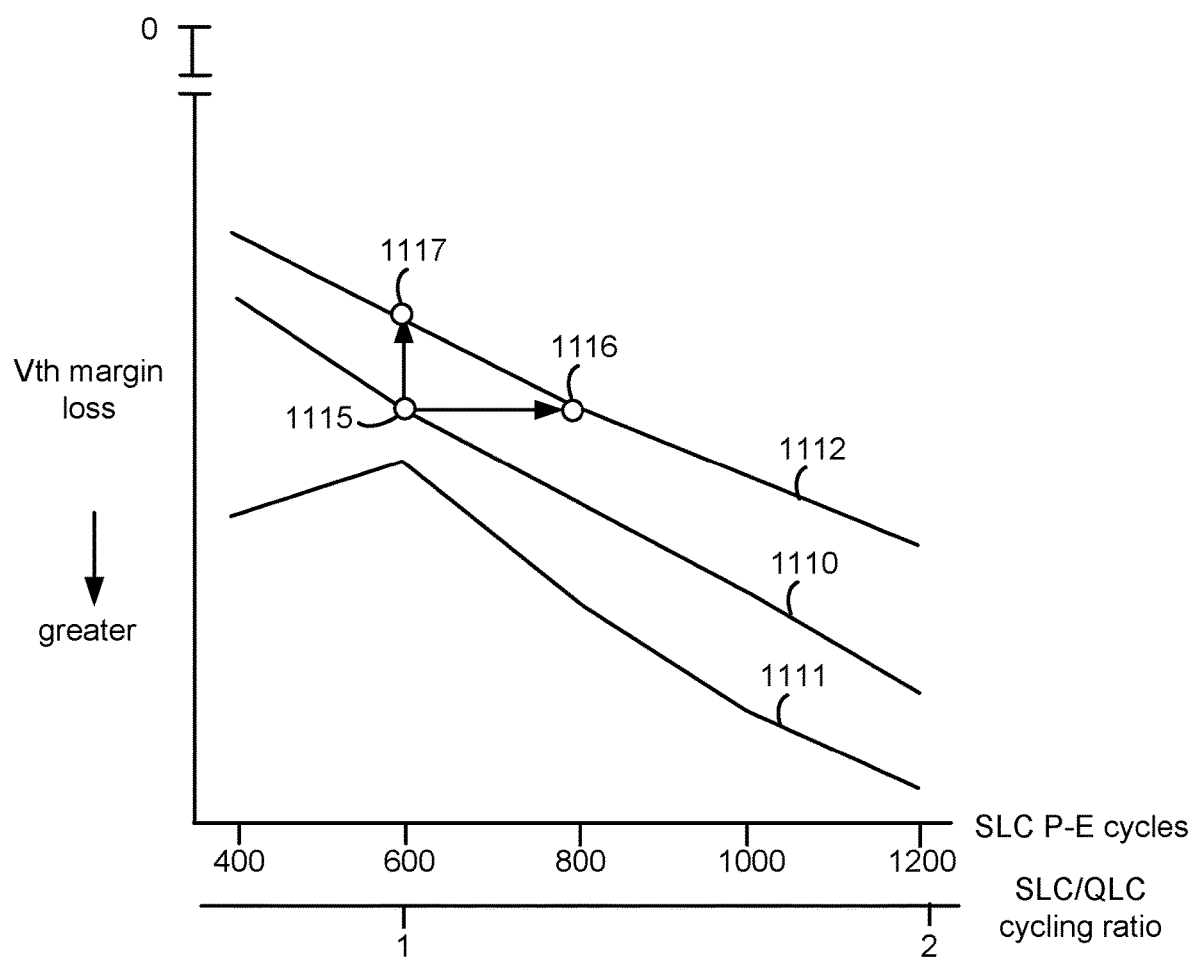
FIG. 11C depicts a plot of Vth margin loss for SLC memory cells vs. a number of P-E cycles and a cycling ratio.

FIG. 11C depicts a plot of Vth margin loss for SLC memory cells vs. a number of P-E cycles and a cycling ratio. The first horizontal axis depicts SLC P-E cycles. The second horizontal axis depicts an SLC/QLC cycling ratio, which represents a number of SLC P-E cycles for a block or other set of memory cells divided by a number of QLC cycles for the block. In this example, there are 600 QLC P-E cycles, and the number of SLC P-E cycles ranges from 400-1200 cycles. The plots indicate that the Vth margin loss generally increases as the number of P-E cycles increases. This is due to damage to the memory cells, such as the accumulation of traps at the interface between the tunneling layer and the polysilicon channel layer.

Plot 1110 depicts the case of SLC programming with a baseline program pulse magnitude (such as Vpgm1a in FIG. 10A) in the initial program loop. Plot 1111 depicts the case of SLC programming with a higher than baseline program pulse magnitude in the initial program loop. Plot 1112 depicts the case of SLC programming with a lower than baseline program pulse magnitude (such as Vpgm1 in FIG. 14A, Vpgm1b in FIG. 14B or Vpgm1c in FIG. 14C) in the initial program loop. A data point 1115 depicts a case of QLC programming with 600 P-E cycles, or a SLC/QLC cycling ratio=1. The horizontal arrow pointing to the data point 1116 from the data point 1115 show that for a fixed Vth margin loss, the number of P-E cycles can be increased to about 800 by using a lower than baseline program pulse magnitude and/or duration in SLC programming. Similarly, the vertical arrow pointing to the data point 1117 from the data point 1115 show that for a fixed number of SLC P-E cycles, the Vth margin loss can be reduced by using a lower than baseline program pulse magnitude and/or duration in SLC programming.

This data indicates Vth margin loss is reduced when the program pulse magnitude and/or duration is reduced in the initial program loop of an SLC program operation.

Figure 12A:
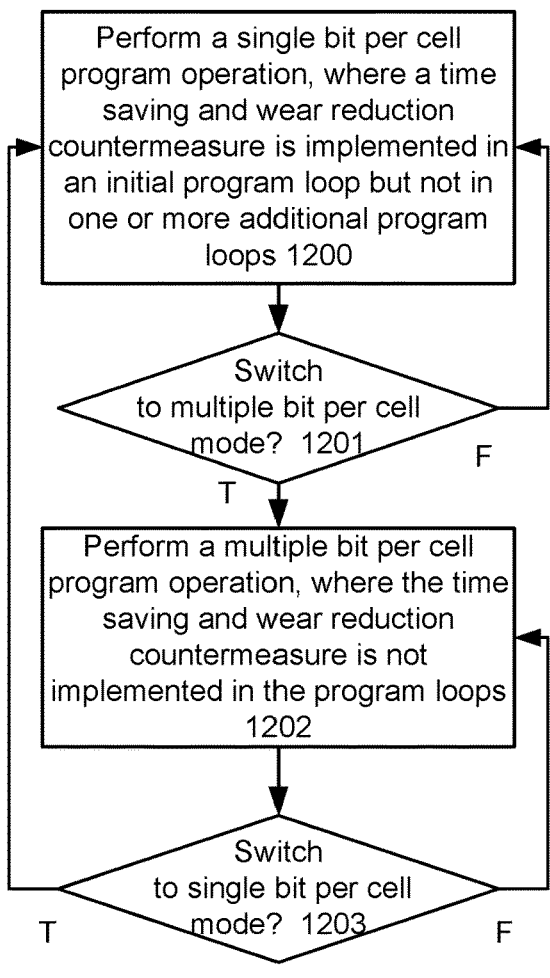
FIG. 12A depicts a flowchart of an example process which cycles between SLC programming and MLC programming for a set of memory cells.

FIG. 12A depicts a flowchart of an example process which cycles between SLC programming and MLC programming for a set of memory cells. A control circuit can be configured to cycle between performing the single bit per cell program operation and performing the multiple bit per cell program operation. That is, one or more SLC program operations can be performed after which one or more MLC program operations are performed.

The process can apply to a set of memory cells such as in a block, a sub-block and/or a word line. Step 1200 includes performing a single bit per cell program operation, where a time saving and wear reduction countermeasure is implemented in an initial program loop but not in one or more additional program loops. As discussed, the time saving and wear reduction countermeasure can involve using a reduced magnitude and/or duration program pulse in the initial program loop. See also FIG. 12B.

A decision step 1201 determines if a condition is met to switch to a multiple bit per cell mode. For example, a control circuit may decide whether the set of memory cells should remain in the single bit per cell mode for a higher reliability storage, or should be switched to the multiple bit per cell mode for a higher density storage. If the decision step is false, step 1200 is repeated for the next program operation for the set of memory cells. If the decision step is true, step 1202 is reached.

Step 1202 includes performing a multiple bit per cell program operation, where the time saving and wear reduction countermeasure of step 1200 is not implemented in the program loops. See also FIG. 12C. A decision step 1203 determines if a condition is met to switch to a single bit per cell mode, similar to the decision step 1201. If the decision step is false, step 1202 is repeated for the next program operation for the set of memory cells. If the decision step is true, step 1200 is reached.

Note that the multiple bit per cell program operation can involve two or more bits per cell. The examples of FIGS. 11A and 11C involve four bits per cell.

Figure 12B:
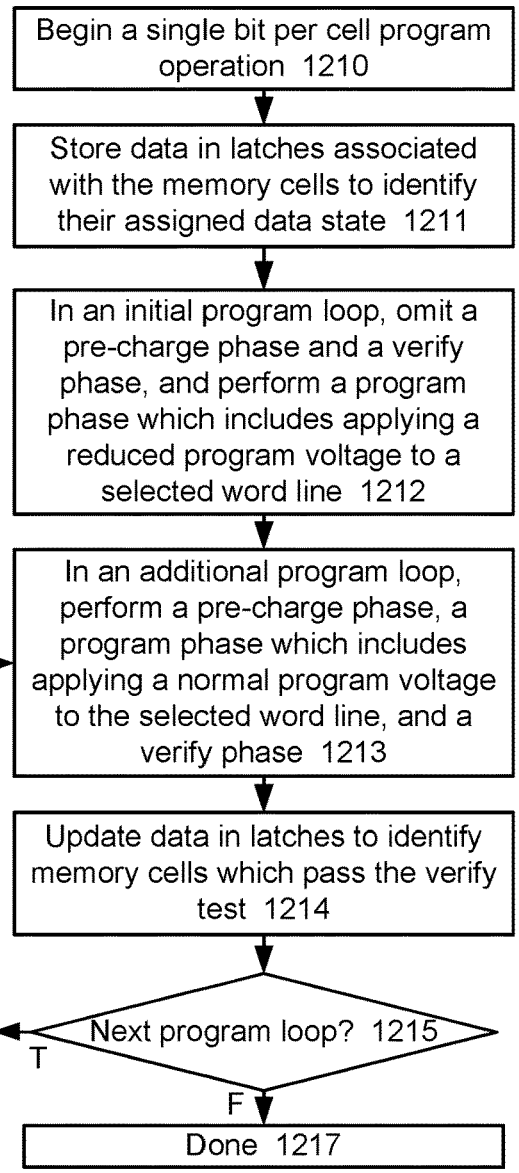
FIG. 12B depicts a flowchart of an example SLC program operation, consistent with FIG. 12A, step 1200.

FIG. 12B depicts a flowchart of an example SLC program operation, consistent with FIG. 12A, step 1200. Step 1210 begins a single bit per cell program operation. Step 1210 includes storing data in latches associated with the memory cells to identify their assigned data state, e.g., Er or P. See the latches of FIG. 2 and the latch data of FIG. 18A. Step 1212 includes, in an initial program loop, omitting a pre-charge phase and a verify phase, and performing a program phase which includes applying a reduced program voltage to a selected word line. For example, see the initial program loop 1300 of FIG. 13A and the voltage signals of FIG. 15A-15G.

Step 1213 includes, in an additional program loop, performing a pre-charge phase, a program phase which includes applying a normal program voltage to the selected word line, and a verify phase. The normal program voltage is higher than the reduced program voltage of step 1212. For example, see the additional program loop 1310 of FIG. 13A and the voltage signals of FIG. 16A-16G.

Step 1214 includes updating data in the latches to identify memory cells which pass the verify test. For example, a latch can be flipped from 0 to 1, consistent with FIG. 18A.

A decision step 1215 determines whether a next program loop is needed in the program operation. When the decision step is true, e.g., when programming is not yet completed for all or nearly all of the memory cells, step 1216 steps up the program voltage and step 1213 follows for a further program loop. When the decision step is false, the program operation is done at step 1217.

In theory, the pre-charge phase and verify phase can be omitted in more than one program loop at the start of a program operation.

FIG. 12C depicts a flowchart of an example MLC program operation, consistent with FIG. 12A, step 1202. Step 1220 begins a multiple bit per cell program operation. Step 1221 includes storing data in latches associated with the memory cells to identify their assigned data state, e.g., S0-S15. See the latches of FIG. 2 and the latch data of FIG. 18B. Step 1222 includes, in a program loop, performing a pre-charge phase, a program phase which includes applying a normal program voltage to the selected word line, and a verify phase. For example, see the program loop 1320 of FIG. 13B and the voltage signals of FIG. 17A-17G.

Step 1223 includes updating data in the latches to identify memory cells which pass the verify test. For example, the latches can be flipped to all 1's, consistent with FIG. 18B.

A decision step 1224 determines whether a next program loop is needed in the program operation. When the decision step is true, e.g., when programming is not yet completed for all or nearly all of the memory cells, step 1225 steps up the program voltage and step 1222 follows for a further program loop. When the decision step is false, the program operation is done at step 1226.

FIG. 13A depicts an example SLC program sequence, consistent with FIGS. 12B, 14A-14C, 15A-15G and 16A-16G. The SLC program sequence includes an initial program loop (e.g., the first program loop in the program operation) followed by one or more additional program loops as shown by the additional program loop 1310. The initial program loop includes a program phase 1301 followed by a recovery phase 1302. The program phase includes channel boosting. In one approach, this involves increasing the voltages of the word lines to Vpass to capacitively couple up the channel voltage. This is in contract to the direct driving of the channels via the ends of the NAND string in a pre-charge phase. The drain and source end select gate transistors can be provided in a non-conductive state so that the channel voltage is floating and can therefore be capacitively coupled up. See FIG. 15A-15G, for example. The purpose of the channel boosting is to decrease the likelihood of program disturb of the unselected memory cells connected to the selected word line by reducing the gate-to-channel voltages.

The selected word line is connected to selected memory cells, e.g., memory cells for which programming is enabled by setting Vbl=0 V, and unselected memory cells, e.g., memory cells for which programming is inhibited by setting Vbl=inhibit. For SLC programming, in the initial program loop, the selected memory cells are those assigned to the P state, such as the memory cell 707a in FIG. 8B, and the unselected memory cells are those assigned to the Er state, such as the memory cell 707 in FIG. 8B. The selected memory cells are in selected NAND strings, such as the NAND string 700*n*1 in FIG. 8B, and the unselected memory cells are in unselected NAND strings, such as the NAND string 700*n*0 in FIG. 8B.

In the additional program loop, the selected memory cells are those assigned to the P state which have not yet completed programming, and the unselected memory cells are those assigned to the Er state and those assigned to the P state which have completed programming.

The channel boosting in the program phase 1301 is followed by application of a reduced program pulse to the selected word line. This can be a program pulse for which the magnitude and/or duration are reduced relative to a program pulse which is used when the time saving and wear reduction countermeasure is not used. The magnitude and/or duration of the reduced program pulse can also be reduced relative to a program pulse in the next or second program loop of the SLC program operation. For example, the magnitude Vpgm1*b* and duration d1 of the program pulse 1411 are less than the magnitude Vpgm2*b* and duration d2, respectively, of the program pulse 1412. The magnitude Vpgm1*b* could be less than 50% or 75% of the magnitude Vpgm2*b*, and the duration d1 could be less than 50% or 75% of the duration d2.

Similarly, in FIG. 14A, the magnitude Vpgm1 of the program pulse 1401 can be less than the magnitude Vpgm2 of the program pulse 1402. The magnitude Vpgm1 could be less than 50% or 75% of the magnitude Vpgm2, for example.

Figure 14B:
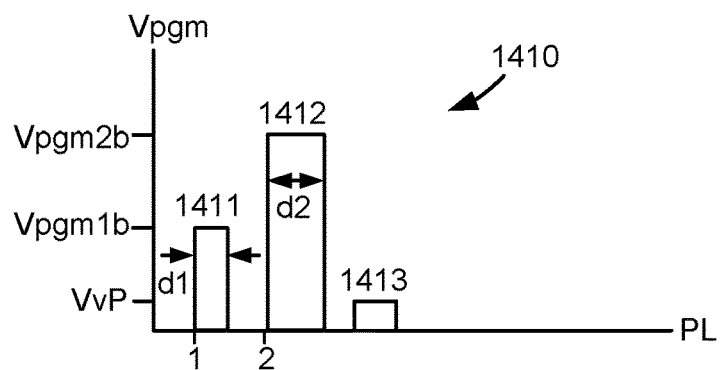
FIG. 14B depicts an example voltage signal 1410 in an SLC program operation consistent with FIG. 13A, where the first program pulse 1411 has a smaller magnitude and a shorter duration compared to the second program pulse 1412, the first program pulse 1411 is not followed by a verify pulse and the second program pulse 1412 is followed by a verify pulse (plot 1413).
Figure 14C:
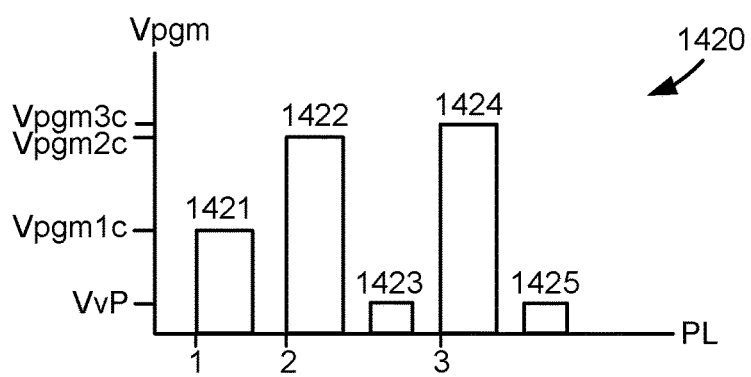
FIG. 14C depicts an example voltage signal 1420 in an SLC program operation consistent with FIG. 13A, where the program pulses have a same duration, the first program pulse 1421 is not followed by a verify pulse, the second program pulse 1422 is followed by a verify pulse (plot 1423), and the third program pulse 1424 is followed by a verify pulse 1425.

Further, as shown in the example of FIG. 14C, the difference in magnitude, or the step size, between the first and second program pulses 1421 and 1422, respectively, can be less than the step size between the second and third program pulses 1422 and 1424, respectively, in an SLC program operation which includes at least three program loops. That is, Vpgm2*c*-Vpgm1*c*>Vpgm3*c*-Vpgm2*c*. In one approach, Vpgm2*c*-Vpgm1*c* is at least two or three times greater than Vpgm3*c*-Vpgm2*c*. That is, the step size following the first program pulse is at least two or three times greater than the step size following the second program pulse.

The reduced program pulse in the program phase 1301 is followed by a recovery phase 1302 comprising a voltage ramp down. In this phase, the word lines voltages can be ramped down from the relatively high levels of Vpass or Vpgm to a lower level at or close to 0 V.

The initial program loop thus omits the pre-charge phase and verify phase of the additional program loop.

The additional program loop 1310 includes a pre-charge phase 1311. This involves pre-charging the channels of the unselected NAND strings such as by applying a positive voltage to the drain and/or source ends of the unselected NAND strings. The positive voltage is applied to the channels of the NAND strings to increase the channel potential to, e.g., 1-2 V. The word line voltages can be elevated to a turn on voltage to provide the memory cells in a conductive state which allows the positive voltage to pass along the length of the channel. For example, see FIG. 16A-16G.

The pre-charge phase is followed by the program phase 1312, which includes the capacitive channel boosting, as discussed, followed by application of a normal program pulse to the selected word line. The normal program pulse has a magnitude and duration which are not reduced as compared to the reduced program pulse, discussed previously. For example, in FIG. 10A, the magnitude Vpgm1*a* of the program pulse 1001 may be more than 75-90% of the magnitude Vpgm2*b* of the program pulse 1003. The durations of the program pulses may be the same, or the duration of the program pulse 1001 may be more than 75-90% of the duration of the program pulse 1003.

The normal program pulse in the program phase 1312 is followed by a recovery phase 1313 comprising a voltage ramp down, similar to the recovery phase 1302.

The recovery phase 1313 is followed by a verify phase 1314 in which a verify test is performed. In the verify test, a verify voltage VvP is applied to the selected word line while the conductive or non-conductive state of the selected memory cells is sensed. Examples of the verify voltage are provided by FIG. 14A, plot 1403, FIG. 14B, plot 1413, FIG. 14C, plots 1423 and 1425, and FIG. 16A, plot 1607.

The additional program loop 1310 is repeated if the verify phase indicates that the program operation is not yet completed.

FIG. 13B depicts an example MLC program sequence, consistent with FIGS. 12C, and 17A-17G. The program loop 1320 represents, e.g., an initial program loop or one or more additional program loops. The program loop 1320 can represent each program loop in a program operation. The program loop 1320 includes a pre-charge phase 1321 similar to the pre-charge phase 1311. A program phase 1322 is similar to the program phase 1312. The program phase 1322 includes the channel boosting, as discussed, followed by application of a normal program pulse to the selected word line. For example, an initial MLC program loop can include the program pulse 1010 of FIG. 10B. Additional MLC program loops can include the program pulses 1011-1029 of FIG. 10B.

The normal program pulses may have a same duration but different magnitudes, such as depicted in FIG. 10B. The magnitudes can vary by a fixed or varying step size.

The program phase 1322 is followed by a recovery phase 1323, similar to the recovery phase 1313, and a verify phase 1324 in which one or more verify tests are performed. In the verify tests, one or more verify voltages, such as one or more of VvS1-VvS15 in FIG. 9C, are applied to the selected word line while the conductive or non-conductive state of the selected memory cells is sensed. Examples of the verify voltages are provided by FIG. 10B, plot 1030, and FIG. 17A, plots 1708-1710.

The program loop 1320 is repeated if the verify phase indicates that the program operation is not yet completed. Typically, an MLC program operation will have many more program loops and a smaller step size compared to an SLC program operation. This allows the MLC program operation to achieve many distinct, narrow Vth distributions which represent the different data states, such as depicted in FIG. 9C.

FIG. 14A depicts an example voltage signal 1400 in an SLC program operation consistent with FIG. 13A, where the first program pulse 1401 has a smaller magnitude but a same duration compared to the second program pulse 1402, the first program pulse 1401 is not followed by a verify pulse and the second program pulse 1402 is followed by a verify pulse (plot 1403). The SLC program operation will generally include at least two program loops with respective program pulses, since the reduced magnitude program pulse in the first program loop is typically insufficient to complete the program operation. As mentioned, the magnitude Vpgm1 of the program pulse 1401 can be less than the magnitude Vpgm2 of the program pulse 1402. The magnitude Vpgm1 could be less than 50% or 75% of the magnitude Vpgm2, for example.

FIG. 14B depicts an example voltage signal 1410 in an SLC program operation consistent with FIG. 13A, where the first program pulse 1411 has a smaller magnitude and a shorter duration compared to the second program pulse 1412, the first program pulse 1411 is not followed by a verify pulse and the second program pulse 1412 is followed by a verify pulse (plot 1413). Specifically, the magnitude Vpgm1*b* and duration d1 of the program pulse 1411 are less than the magnitude Vpgm2*b* and duration d2, respectively, of the program pulse 1412. The magnitude Vpgm1*b* could be less than 50% or 75% of the magnitude Vpgm2*b*, and the duration dl could be less than 50% or 75% of the duration d2. By reducing the magnitude and/or duration of the program pulse in the first program loop of an SLC program operation, the likelihood of program disturb is reduced. In particular, since the pre-charge phase is omitted, the channel voltage of the unselected NAND strings will be lower than if the pre-charge phase occurred. In this case, the unselected NAND strings would be more susceptible to program disturb if the magnitude and/or duration of the program pulse were not reduced.

FIG. 14C depicts an example voltage signal 1420 in an SLC program operation consistent with FIG. 13A, where the program pulses have a same duration, the first program pulse 1421 is not followed by a verify pulse, the second program pulse 1422 is followed by a verify pulse (plot 1423), and the third program pulse 1424 is followed by a verify pulse (plot 1425). The magnitude Vpgm1*c* of the first program pulse 1421 is significantly lower than the magnitude Vpgm2*c* of the second program pulse 1422, as in FIG. 14B. However, the magnitude Vpgm2*c* of the second program pulse 1422 is just slightly lower than the magnitude Vpgm3*c* of the third program pulse 1424. That is, the step size is relatively large for the second program pulse compared to the first program pulse, and relatively small for the third program pulse compared to the second program pulse, and for any subsequent program pulses such as a fourth program pulse (not shown) compared to the third program pulse.

For example, the step size Vpgm2*c*-Vpgm1*c* can be at least two or three times greater than the step size Vpgm3*c*-Vpgm2*c*.

FIG. 15A-15G are voltage signals consistent with the initial program loop 1300 of the SLC program sequence of FIG. 13A. In FIG. 15A-15G, the vertical dimension denotes voltage and the horizontal dimension denotes time, with time points W48. The period of time depicted corresponds to one program loop and includes the program phase 1301 and the recovery phase 1302 of FIG. 13A. The voltages depicted are examples.

FIG. 15A depicts voltages applied to a selected word line, WLn in a program loop of a program operation, consistent with the initial program loop 1300 of the SLC program sequence of FIG. 13A.

In the program phase 1301, a plot 1502 represents a program pass voltage, Vpass, e.g., 8-9 V, and a plot 1503 represents a program voltage of Vpgm, e.g., 15-25 V. In the recovery phase 1302, a plot 1504 represents, e.g., 0 V.

FIG. 15B depicts a voltage, VWL_unsel, applied to unselected word lines, consistent with FIG. 15A. A plot 1511 represents Vpass=10 V and a plot 1512 represents, e.g., 0 V.

FIG. 15C depicts a voltage, Vbl_sel, applied to bit lines of selected NAND strings, consistent with FIG. 15A. A plot 1521 represents 0 V.

FIG. 15D depicts a voltage, Vbl_unsel, applied to bit lines of inhibited NAND strings, consistent with FIG. 15A. These are inhibited NAND strings in a selected sub-block, for example, in which programming occurs. A plot 1530 represents 2 V and a plot 1531 represents 0 V.

FIG. 15E depicts a voltage, Vsgd_sel, applied to SGD transistors of a selected sub-block in which programming occurs, consistent with FIG. 15A. A plot 1541 represents a turn on voltage of 2.5 V and a plot 1542 represents a turn off voltage of 0 V.

FIG. 15F depicts voltages applied to SGD transistors of unselected sub-blocks and to SGS transistors, consistent with FIG. 15A. A plot 1551 represents a turn off voltage of 0 V for Vsgd_unsel and Vsgs.

FIG. 15G depicts a voltage applied to a source line, consistent with FIG. 15A. A plot 1560 represents 1-2 V and a plot 1561 represents 0 V.

In the program phase, VWLn and Vwl_unsel are ramped up, e.g., starting at t1, to provide a capacitive coupling up of the channels of the inhibited NAND strings. VWLn is then ramped up further at t2 to the peak level of Vpgm and held at Vpgm until t3. After the application of the program pulse, the word line voltages are ramped down in the recovery phase.

During the program pulse, Vsgd_sel is high enough to provide the selected SGD transistors in a conductive state for the selected or programmed NAND strings, which receive Vbl_sel=0 V, but low enough to provide the selected SGD transistors in a non-conductive state for the unselected or inhibited NAND strings, which receive Vbl_unsel=2 V.

FIG. 16A-16G are voltage signals consistent with the additional program loop 1310 of the SLC program sequence of FIG. 13A. In FIG. 16A-16G, the vertical dimension denotes voltage and the horizontal dimension denotes time, with time points t0-t12. The period of time depicted corresponds to one program loop and includes a pre-charge phase 1311, a program phase 1312, a recovery phase 1313 and a verify phase 1314. The voltages depicted are examples.

FIG. 16A depicts voltages applied to a selected word line, WLn in a program loop of a program operation, consistent with the additional program loop 1310 of the SLC program sequence of FIG. 13A. A plot 1601 represents 6 V, a plot 1602 represents Vpass, a plot 1603 represents Vpgm, a plot 1604 represents a recovery voltage of Vcc=3 V, a plot 1605 represents a read pass voltage, Vread, e.g., 8-9 V, a plot 1606 represents 0 V, and a plot 1607 represent a verify voltage VvP. During the application of each verify voltage, a sensing operation occurs for the memory cells which are assigned to the data state being verified. The selected memory cells are connected to a selected word line, and can be in a selected sub-block. A program pulse comprises the plots 1602 and 1603.

FIG. 16B depicts a voltage, VWL_unsel, applied to unselected word lines, consistent with FIG. 16A. A plot 1614 represents 6 V, a plot 1611 represents Vpass, and a plot 1612 represents a recovery or transition voltage, Vpass2Vread. This refers to a positive voltage which is applied in a transition from Vpass to Vread. A plot 1613 represents Vread.

FIG. 16C depicts a voltage, Vbl_sel, applied to bit lines of selected NAND strings, consistent with FIG. 16A. A plot 1620 represents 1-2 V, a plot 1621 represents 0 V and a plot 1622 represents 0.5 V.

FIG. 16D depicts a voltage, Vbl_unsel, applied to bit lines of inhibited NAND strings, consistent with FIG. 16A. These are inhibited NAND strings in a selected sub-block. A plot 1630 represents 2 V, a plot 1631 represents 0 V at t7-t9 in the recovery phase, and a plot 1632 represents 2 V in the verify phase.

FIG. 16E depicts a voltage, Vsgd_sel, applied to SGD transistors of a selected sub-block, consistent with FIG. 16A. A plot 1640 represents a turn on voltage of 6-8 V, a plot 1641 represents a turn on voltage of 2.5 V, a plot 1642 represents a turn off voltage of 0 V and a plot 1643 represents a turn on voltage of 6-8 V.

FIG. 16F depicts voltages applied to SGD transistors of unselected sub-blocks and to SGS transistors, consistent with FIG. 16A. A plot 1650 represents a turn on voltage of 6-8 V when the NAND string is to be pre-charged from the source end, or a plot 1654 represents a turn off voltage of 0 V when the NAND string is not to be pre-charged from the source end. Generally, a NAND string can be pre-charged from the source end and/or drain end. To pre-charge from the source end, a positive voltage Vsl is applied while the SGS transistor (or multiple SGS transistors in a NAND string) is provided in a conductive state by applying a sufficiently high control gate voltage Vsgs. To pre-charge from the drain end, a positive voltage Vb is applied while the SGD transistor (or multiple SGD transistors in a NAND string) is provided in a conductive state by applying a sufficiently high control gate voltage Vsgd_unsel.

A plot 1651 represents 0 V for Vsgd_unsel and Vsgs. A plot 1652 represents 6-8 V for Vsgs and a plot 1653 represents 0 V for Vsgd_unsel.

FIG. 16G depicts a voltage applied to a source line, consistent with FIG. 16A. A plot 1660 represents 1-2 V, a plot 1661 represents 0 V and a plot 1662 represents 1-2 V. In the pre-charge phase, a positive Vbl_unsel (plot 1630) is provided to the drain ends of the inhibited NAND strings (and to the channels of the NAND strings) to remove residue electrons and to provide a small amount of boosting such as 1-2 V. The SGD transistors of the selected and unselected sub-blocks are in a conductive state at this time, with a voltage of 6-8 V, for example. This allows the bit line voltages to be passed to the drain ends of the NAND strings. It is also possible for the SGS transistors of the selected and unselected sub-blocks to be in a conductive state at this time, with a voltage of 6-8 V, for example to allow Vsl to be passed to the source ends of the NAND strings. A plot 1631 represents Vbl_unsel returning to 0 V at t7-t9 in part of the recovery phase, and a plot 1632 represents Vbl_unsel at 2 V during the verify phase, for example.

In one approach, the pre-charging of the channels of the respective unselected NAND strings comprises applying a positive voltage to at least one end of each of the respective unselected NAND strings while applying a turn-on voltage to a select gate transistor at the at least one end of each of the respective unselected NAND strings and applying a turn-on voltage to the set of word lines. The plots 1601, 1614, 1640 and 1650 are examples of turn-on voltages which provide WLn, WL_unsel, SGD_sel and SGS/SGD_unsel, respectively, in a conductive state. Further, the pre-charging of the channels of the respective unselected NAND strings can occur via at least one end of each of the respective unselected NAND strings.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the selected NAND strings, which receive Vbl_sel=0 V, but low enough to provide the selected SGD transistors in a non-conductive state for the unselected NAND strings, which receive Vbl_unsel=2 V.

During the verify phase, the SGD and SGS transistors are in a strongly conductive state to allow sensing to occur for the selected memory cells.

FIG. 17A-17G are voltage signals consistent with the program loop 1320 of the MLC program sequence of FIG. 13B. In FIG. 17A-17G, the vertical dimension denotes voltage and the horizontal dimension denotes time, with time points t0-t14. The period of time depicted corresponds to one program loop and includes a pre-charge phase 1321, a program phase 1322, a recovery phase 1323 and a verify phase 1324. The voltages depicted are examples.

FIG. 17A depicts voltages applied to a selected word line, WLn in a program loop of a program operation, consistent with the program loop 1320 of the MLC program sequence of FIG. 13B. A plot 1701 represents 6 V, a plot 1702 represents Vpass, a plot 1703 represents Vpgm, a plot 1704 represents a recovery voltage of Vcc=3 V, a plot 1705 represents Vread, a plot 1706 represents 0 V, and plots 1708, 1709 and 1710 represent example verify voltages VvS1, VvS2 and VvS3, respectively. During the application of each verify voltage, a sensing operation occurs for the memory cells which are assigned to the data state being verified. The selected memory cells are connected to a selected word line, and can be in a selected sub-block.

FIG. 17B depicts a voltage, VWL_unsel, applied to unselected word lines, consistent with FIG. 17A. A plot 1714 represents 6 V, a plot 1711 represents Vpass, and a plot 1712 represents Vpass2Vread. A plot 1713 represents Vread.

FIG. 17C depicts a voltage, Vbl_sel, applied to bit lines of selected NAND strings, consistent with FIG. 17A. A plot 1720 represents 1-2 V, a plot 1721 represents 0 V and a plot 1722 represents 0.5 V.

FIG. 17D depicts a voltage, Vbl_unsel, applied to bit lines of inhibited NAND strings, consistent with FIG. 17A. These are inhibited NAND strings in a selected sub-block. A plot 1730 represents 2 V, a plot 1731 represents 0 V at t7-t9 in the recovery phase, and a plot 1732 represents 2 V in the verify phase.

FIG. 17E depicts a voltage, Vsgd_sel, applied to SGD transistors of a selected sub-block, consistent with FIG. 17A. A plot 1740 represents 6-8 V, a plot 1741 represents 2.5 V, a plot 1742 represents 0 V and a plot 1743 represents 6-8 V.

FIG. 17F depicts voltages applied to SGD transistors of unselected sub-blocks and to SGS transistors, consistent with FIG. 17A. A plot 1750 represents 6-8 V when the NAND string is to be pre-charged from the source end, or a plot 1754 represents 0 V when the NAND string is not to be pre-charged from the source end. Generally, a NAND string can be pre-charged from the source end and/or drain end, as discussed.

A plot 1751 represents 0 V for Vsgd_unsel and Vsgs. A plot 1752 represents 6-8 V for Vsgs and a plot 1753 represents 0 V for Vsgd_unsel.

FIG. 17G depicts a voltage applied to a source line, consistent with FIG. 17A. A plot 1760 represents 1-2 V, a plot 1761 represents 0 V and a plot 1762 represents 1-2 V.

FIG. 18A depicts an example of latch data during SLC programming, consistent with FIG. 12B, step 1211 and 1214. The data may be stored in a latch associated with each NAND string. For example, in FIG. 2, one of the latches LP, LMP, UMP and UP could be used. In this example, a logical 1 represents the erased (Er) state and a logical 0 represents the programmed (P) state.

FIG. 18B depicts an example of latch data during MLC programming, consistent with FIG. 12C, step 1221 and 1223. For example, in FIG. 2, each of the latches LP, LMP, UMP and UP could be used. In the case of sixteen data states, four bits in the latches can identify the assigned data state of a memory cell in the NAND string. The assigned data states include the erased state S0 and the programmed data states S1-S15. In one example, the LP/LMP/UMP/UP latches store 1/1/1/1, 0/0/0/0, 1/0/0/0, 0/1/0/0, 1/1/0/0, 0/0/1/0, 1/0/1/0, 0/1/1/0, 1/1/1/0, 0/0/0/1, 1/0/0/1, 0/1/0/1, 1/1/0/1, 0/0/1/1, 1/0/1/1, and 0/1/1/1 for the S0-S15 data states, respectively.

Accordingly, it can be seen that, in an example implementation, an apparatus comprises a control circuit configured to connect to a set of word lines, the set of word lines comprise a selected word line connected to a set of memory cells, each memory cell is in a NAND string among a set of NAND strings and each NAND string comprises a channel. The control circuit, to perform an initial program loop in a program operation, is configured to apply a program pulse to the selected word line without pre-charging channels of respective unselected NAND strings of the set of NAND strings before the applying of the program pulse; and the control circuit, to perform an additional program loop of the program operation, is configured to apply a program pulse to the selected word line after pre-charging the channels of the respective unselected NAND strings.

In another example implementation, a method comprises performing a program operation for a set of memory cells connected to a selected word line in a set of word lines, each memory cell is in a NAND string among a set of NAND strings and each NAND string comprises a channel. The performing the program operation comprises: when the program operation is a single bit per cell program operation, performing an initial program loop of the program operation which omits pre-charging channels of respective unselected NAND strings of the set of NAND strings before applying a respective program pulse to the selected word line; and when the program operation is a multiple bit per cell program operation, performing an initial program loop of the program operation which pre-charges channels of respective unselected NAND strings of the set of NAND strings before applying a respective program pulse to the selected word line.

In another implementation, an apparatus comprises a control circuit configured to connect to a set of word lines, the set of word lines comprise a selected word line connected to a set of memory cells, each memory cell is in a NAND string among a set of NAND strings and each NAND string comprises a channel; and a memory interface connected to the control circuit. The control circuit is configured to issue a command via the memory interface to perform a single bit per cell program operation for the selected word line, and to perform an initial program loop in the single bit per cell program operation, is configured to perform a program phase without performing a pre-charge phase and without performing a verify phase, and to perform an additional program loop of the single bit per cell program operation, after the initial program loop, is configured to perform a pre-charge phase, followed by a program phase, followed by a verify phase.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a set of word lines, the set of word lines comprise a selected word line connected to a set of memory cells, each memory cell is in a NAND string among a set of NAND strings and each NAND string comprises a channel;
the control circuit, to perform an initial program loop in a program operation, is configured to apply a program pulse to the selected word line without pre-charging channels of respective unselected NAND strings of the set of NAND strings before the applying of the program pulse such that the channels of respective unselected NAND strings are at a first voltage when the program pulse is applied; and
the control circuit, to perform an additional program loop of the program operation, is configured to apply a program pulse to the selected word line while the channels of the respective unselected NAND strings remain at a second voltage that is higher than the first voltage from pre-charging the channels of the respective unselected NAND strings.

2. The apparatus of claim 1, wherein:
in the additional program loop, the control circuit is configured to perform a verify test for the set of memory cells after the applying of the program pulse to the selected word line; and
in the initial program loop, the control circuit is configured to omit a verify test for the set of memory cells.

3. The apparatus of claim 1, wherein:
the pre-charging of the channels of the respective unselected NAND strings comprises applying a positive voltage to at least one end of each of the respective unselected NAND strings while applying a turn-on voltage to a select gate transistor at the at least one end of each of the respective unselected NAND string and applying a turn-on voltage to the set of word lines.

4. The apparatus of claim 1, wherein:
the pre-charging of the channels of the respective unselected NAND strings occurs via at least one end of each of the respective unselected NAND strings.

5. The apparatus of claim 1, wherein:
the control circuit is configured to perform the initial program loop without pre-charging channels of the respective unselected NAND strings in response to a number of program-erase cycles of the set of memory cells exceeding a threshold.

6. The apparatus of claim 1, wherein:
a magnitude of the program pulse in the initial program loop is based on a position of the selected word line in the set of word lines.

7. The apparatus of claim 1, wherein:
the word lines in the set of word lines are at different heights above a substrate; and
a magnitude of the program pulse in the initial program loop is an increasing function of a height of the selected word line above the substrate.

8. The apparatus of claim 1, wherein:
a duration of the program pulse in the initial program loop is less than a duration of the program pulse in the additional program loop.

9. The apparatus of claim 1, wherein:
the program operation comprises a single bit per cell program operation; and
the control circuit, to perform an initial program loop of a multiple bit per cell program operation for the set of memory cells, is configured to apply a program pulse to the selected word line after pre-charging the channels of respective unselected NAND strings of the set of NAND strings.

10. The apparatus of claim 9, wherein:
in the initial program loop and the additional program loop of the multiple bit per cell program operation, the control circuit is configured to perform a verify test for the set of memory cells after the applying of the program pulse to the selected word line.

11. The apparatus of claim 9, wherein:
the control circuit is configured to cycle between performing the single bit per cell program operation and performing the multiple bit per cell program operation.

12. A method, comprising:
performing program operations for a set of memory cells connected to a selected word line in a set of word lines, each memory cell is in a NAND string among a set of NAND strings and each NAND string comprises a channel, the performing the program operations comprises:
  performing a first program operation that is a single bit per cell program operation, performing an initial program loop of the first program operation which omits pre-charging channels of respective unselected NAND strings of the set of NAND strings before applying a respective program pulse to the selected word line; and
  performing a second program operation that is a multiple bit per cell program operation, including performing an initial program loop of the second program operation which pre-charges channels of respective unselected NAND strings of the set of NAND strings before applying a respective program pulse to the selected word line.

13. The method of claim 12, wherein:
in the first program operation, the initial program loop omits a verify test after the applying of the respective program pulse; and
in the second program operation, the performing the initial program loop comprises performing a verify test after the applying of the respective program pulse.

14. The method of claim 12, wherein:
in the first program operation, performing an additional program loop of the program operation which pre-charges channels of respective unselected NAND strings of the set of NAND strings before applying a respective program pulse to the selected word line; and
in the second program operation, performing an additional program loop of the program operation which pre-charges channels of respective unselected NAND strings of the set of NAND strings before applying a respective program pulse to the selected word line.

15. The method of claim 12, wherein:
the pre-charging of the channels of the respective unselected NAND strings comprises applying a positive voltage to the channels at drain ends of the respective unselected NAND strings while applying a turn-on voltage to select gate transistors at the drain ends of the respective unselected NAND string and applying a turn-on voltage to the set of word lines.

16. An apparatus, comprising:
a control circuit configured to connect to a set of word lines, the set of word lines comprise a selected word line connected to a set of memory cells, each memory cell is in a NAND string among a set of NAND strings and each NAND string comprises a channel; and
a memory interface connected to the control circuit, the control circuit is configured to issue a command via the memory interface to perform a single bit per cell program operation for the selected word line, and to perform an initial program loop in the single bit per cell program operation, is configured to perform a program phase without performing a pre-charge phase such that the channels of respective unselected NAND strings are at a first voltage when the program pulse is applied and without performing a verify phase, and to perform an additional program loop of the single bit per cell program operation, after the initial program loop, is configured to perform a pre-charge phase, followed by a program phase while the channels of the respective unselected NAND strings remain at a second voltage that is higher than the first voltage from the pre-charge phase, followed by a verify phase.

17. The apparatus of claim 16, wherein:
the control circuit is configured to allocate less time for the performing of the initial program loop than to the performing of the additional program loop.

18. The apparatus of claim 16, wherein:
the control circuit is configured to issue a command via the memory interface to perform a multiple bit per cell program operation for the selected word line, and to perform an initial program loop in the multiple bit per cell program operation, is configured to perform a perform a pre-charge phase, followed by a program phase, followed by a verify phase.

19. The apparatus of claim 18, wherein:
the control circuit is configured to cycle between performing the single bit per cell program operation and performing the multiple bit per cell program operation.

20. The apparatus of claim 18, wherein:
the multiple bit per cell program operation is configured to programs the set of memory cells with at least a three bits per cell.

* * * * *